(12) United States Patent
Yamazaki et al.

(10) Patent No.: US 7,709,895 B2
(45) Date of Patent: May 4, 2010

(54) SEMICONDUCTOR DEVICE HAVING INSULATING STRIPE PATTERNS

(75) Inventors: Shunpei Yamazaki, Tokyo (JP); Atsuo Isobe, Kanagawa (JP); Hidekazu Miyairi, Kanagawa (JP); Hideomi Suzawa, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 71 days.

(21) Appl. No.: 10/357,381

(22) Filed: Feb. 4, 2003

(65) Prior Publication Data
US 2003/0209710 A1    Nov. 13, 2003

(30) Foreign Application Priority Data
Feb. 8, 2002    (JP)    ............... 2002-033262

(51) Int. Cl.
*H01L 27/12*    (2006.01)
(52) U.S. Cl. ............... 257/354; 257/57; 257/59; 257/72; 257/E29.295
(58) Field of Classification Search ............... 257/52, 257/57, 59, 64, 72, 353, 354, 347, 627, E29.293, 257/E29.295
See application file for complete search history.

(56) References Cited

U.S. PATENT DOCUMENTS

| | | | |
|---|---|---|---|
| 4,330,363 A | 5/1982 | Biegesen et al. | |
| 5,338,959 A | 8/1994 | Kim et al. | |
| 5,854,803 A | 12/1998 | Yamazaki et al. | |
| 6,472,684 B1 * | 10/2002 | Yamazaki et al. | 257/72 |
| 6,528,397 B1 | 3/2003 | Taketomi et al. | |
| 6,586,802 B2 * | 7/2003 | Miyamoto et al. | 257/347 |
| 6,667,188 B2 * | 12/2003 | Tanabe | 438/48 |
| 6,674,136 B1 * | 1/2004 | Ohtani | 257/408 |
| 6,700,133 B1 * | 3/2004 | Ohtani et al. | 257/66 |
| 6,780,687 B2 * | 8/2004 | Nakajima et al. | 438/149 |
| 6,784,457 B2 * | 8/2004 | Yamazaki et al. | 257/72 |
| 6,806,498 B2 | 10/2004 | Taketomi et al. | |
| 6,879,002 B2 * | 4/2005 | Miyamoto et al. | 257/347 |
| 2001/0015441 A1 * | 8/2001 | Kawasaki et al. | 257/66 |

(Continued)

FOREIGN PATENT DOCUMENTS

EP    1 049 144    11/2000

(Continued)

*Primary Examiner*—Matthew E Warren
(74) *Attorney, Agent, or Firm*—Eric J. Robinson; Robinson Intellectual Property Law Office, P.C.

(57) ABSTRACT

An uneven portion is formed on a substrate extending in a linear shape stripe pattern, convex portions of an insulating film that intersects with a crystalline semiconductor film divided into island shapes are removed, and an amorphous semiconductor film is formed on the insulating film. The semiconductor film is melted and flows into concave portions of the insulating film, where it crystallizes, and the semiconductor film that remains on the convex portions of the insulating film is removed. A semiconductor film divided into island shapes is then formed from the semiconductor film formed in the concave portions, the convex portions of the insulating film are removed in portions where channel forming regions are to be formed, thus exposing side surface portions of the semiconductor film. A gate insulating film and a gate electrode contacting the side surface portions and upper surface portions of the semiconductor film are then formed.

16 Claims, 30 Drawing Sheets
(1 of 30 Drawing Sheet(s) Filed in Color)

U.S. PATENT DOCUMENTS

| | | |
|---|---|---|
| 2001/0035526 A1 | 11/2001 | Yamazaki et al. |
| 2002/0004292 A1 | 1/2002 | Yamazaki et al. |
| 2002/0008801 A1* | 1/2002 | Fukada et al. .................. 349/56 |
| 2002/0098628 A1 | 7/2002 | Hamada et al. |
| 2002/0134981 A1 | 9/2002 | Nakamura et al. |
| 2003/0141505 A1 | 7/2003 | Isobe et al. |
| 2003/0141521 A1 | 7/2003 | Isobe et al. |
| 2003/0181043 A1 | 9/2003 | Tanada et al. |
| 2003/0183854 A1 | 10/2003 | Kato et al. |
| 2003/0183875 A1 | 10/2003 | Isobe et al. |
| 2003/0186490 A1 | 10/2003 | Kato et al. |
| 2003/0218169 A1 | 11/2003 | Isobe et al. |
| 2003/0218170 A1 | 11/2003 | Yamazaki et al. |
| 2003/0218171 A1 | 11/2003 | Isobe et al. |
| 2003/0218177 A1 | 11/2003 | Yamazaki |
| 2003/0230749 A1 | 12/2003 | Isobe et al. |
| 2003/0230750 A1 | 12/2003 | Koyama et al. |
| 2004/0016958 A1 | 1/2004 | Kato et al. |
| 2004/0016967 A1 | 1/2004 | Yamazaki et al. |
| 2004/0063258 A1* | 4/2004 | Kasahara et al. ............ 438/160 |

FOREIGN PATENT DOCUMENTS

| | | |
|---|---|---|
| JP | 57-157519 | 9/1982 |
| JP | 57-196522 | 12/1982 |
| JP | 58-151042 | 9/1983 |
| JP | 58-178565 | 10/1983 |
| JP | 59-125663 | 7/1984 |
| JP | 61-241909 | 10/1986 |
| JP | 62-104117 | 5/1987 |
| JP | 02-143417 | 6/1990 |
| JP | 04-324622 | 11/1992 |
| JP | 06-085256 | 3/1994 |
| JP | 08-195357 | 7/1996 |
| JP | 10-125923 | 5/1998 |
| JP | 2000-068520 | 3/2000 |
| JP | 2000-183351 | 6/2000 |
| JP | 2001-144027 | 5/2001 |

* cited by examiner

FIG. 5A $d < t02$, and W1 and W2 $\leq 1\,\mu m$
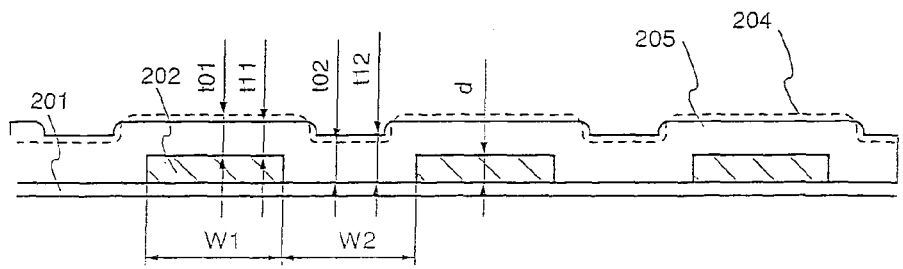
FIG. 5B $d \geq t02$, and W1 and W2 $\leq 1\,\mu m$
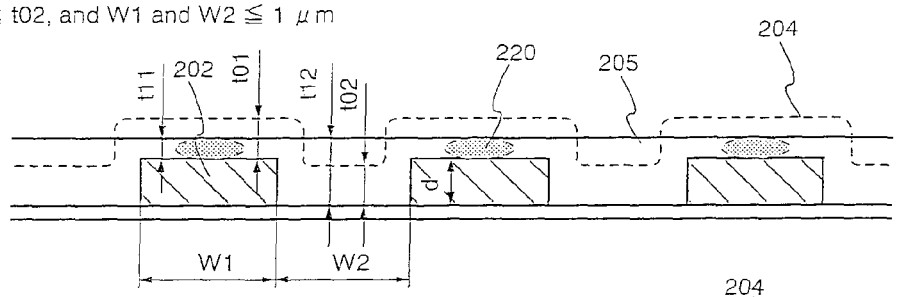
FIG. 5C $d \gg t02$, and W1 and W2 $\leq 1\,\mu m$
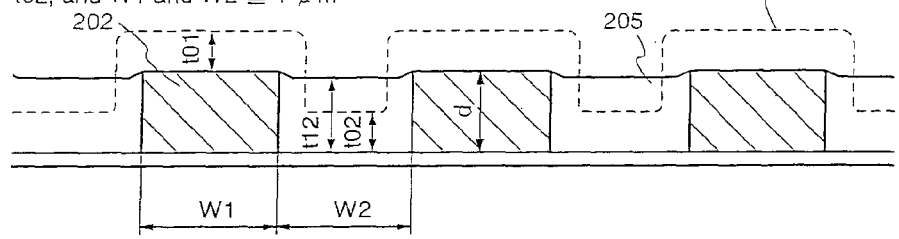
FIG. 5D $d \geq t02$, and W1 and W2 $\geq 1\,\mu m$
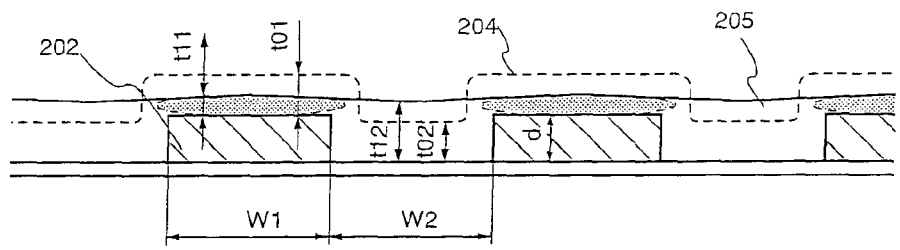
FIG. 5E $d \geq t02$, and W1 and W2 $> 1\,\mu m$
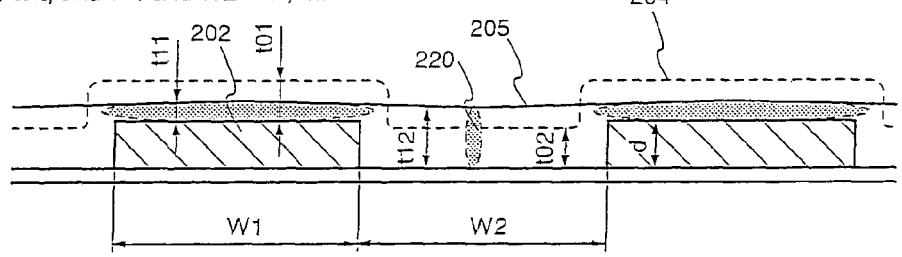

305(303)  307  305  304

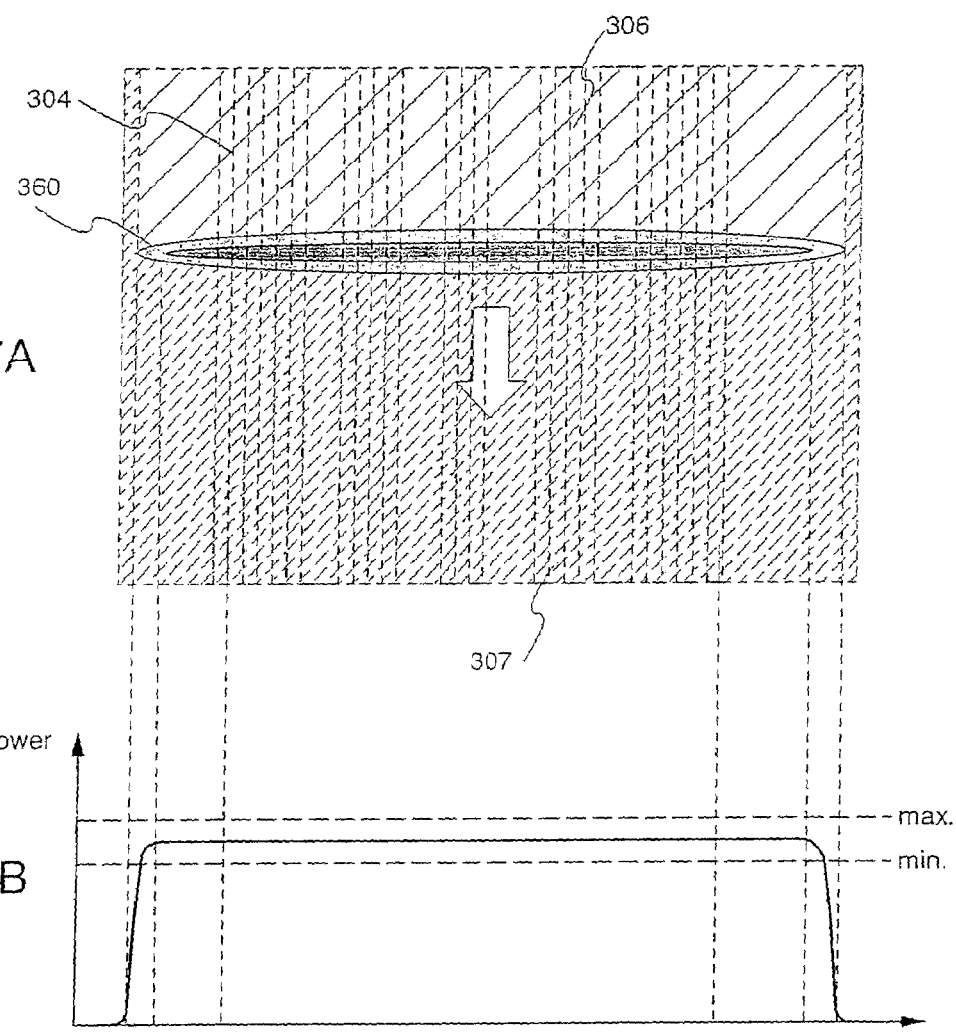

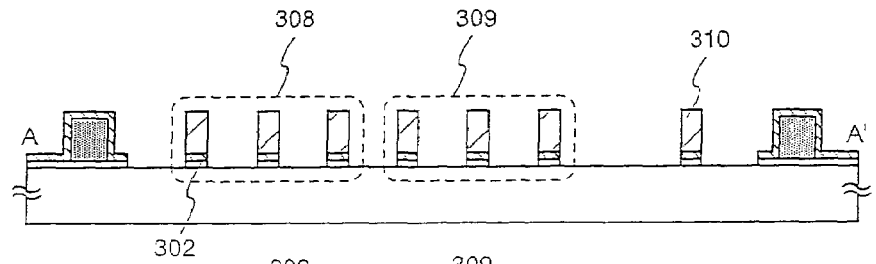
FIG. 18A
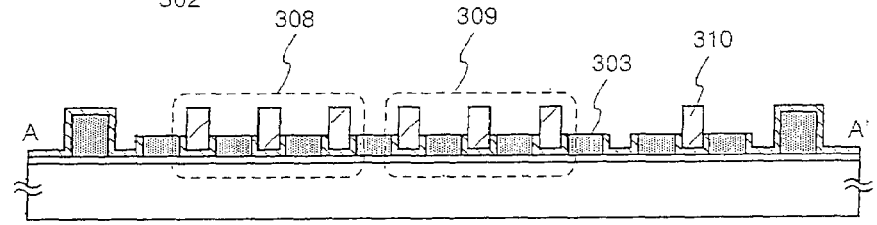
FIG. 18B
FIG. 19
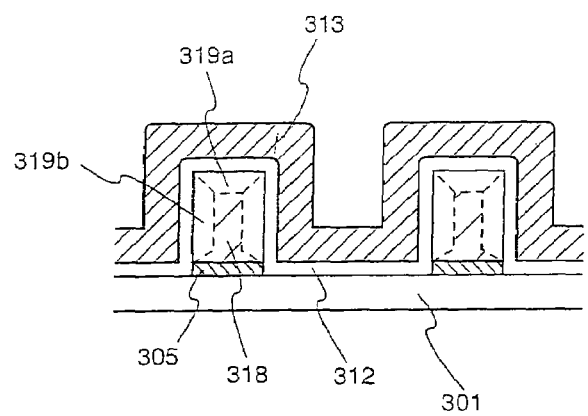

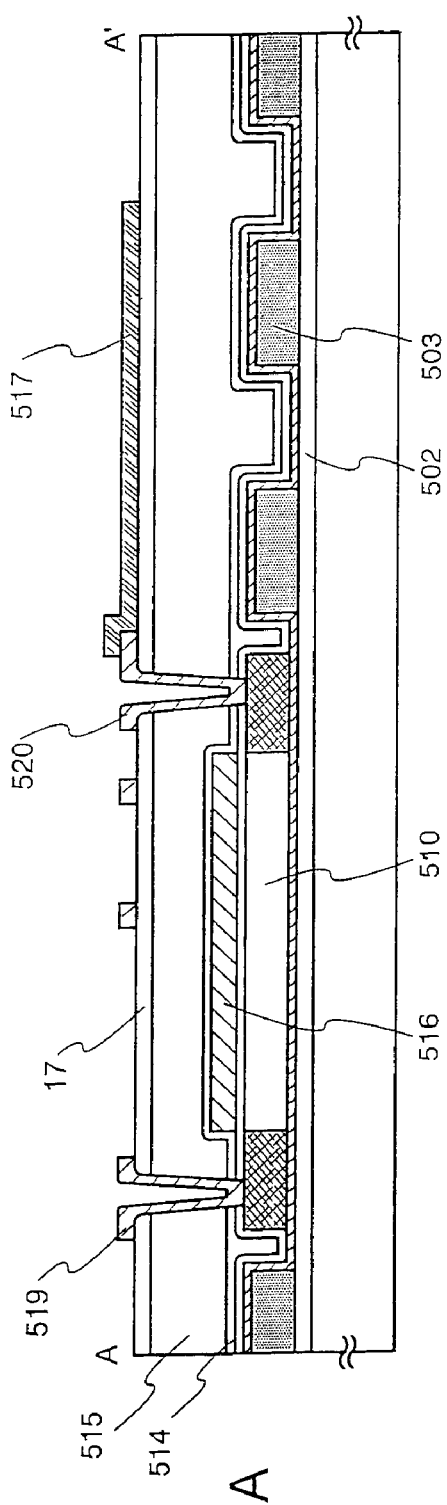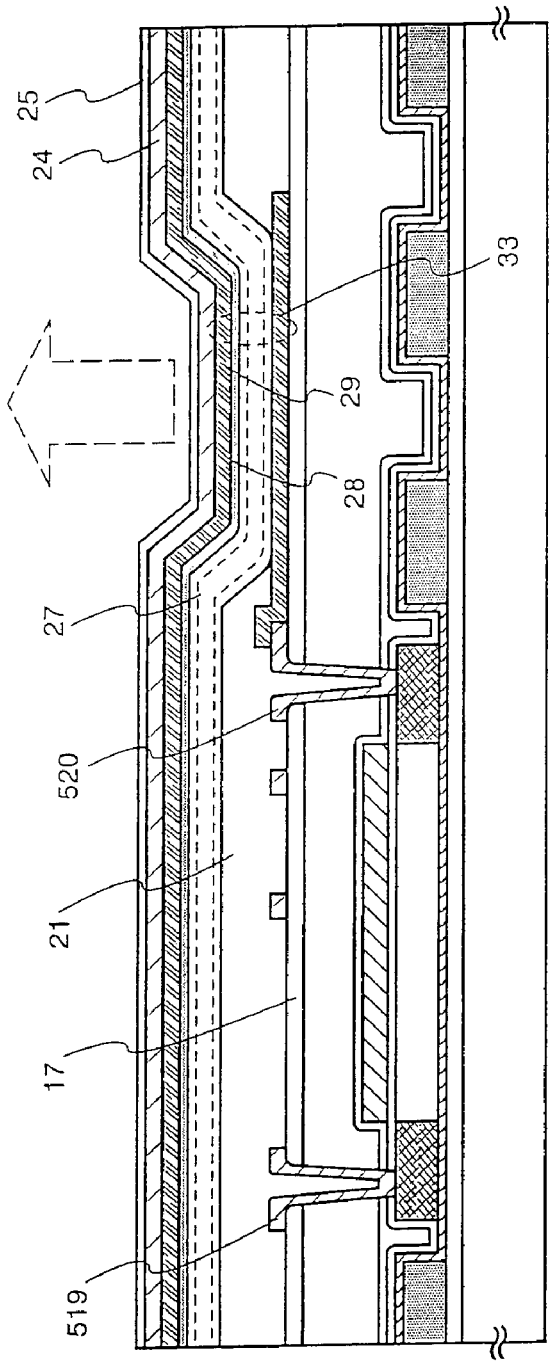
FIG. 28A
FIG. 28B

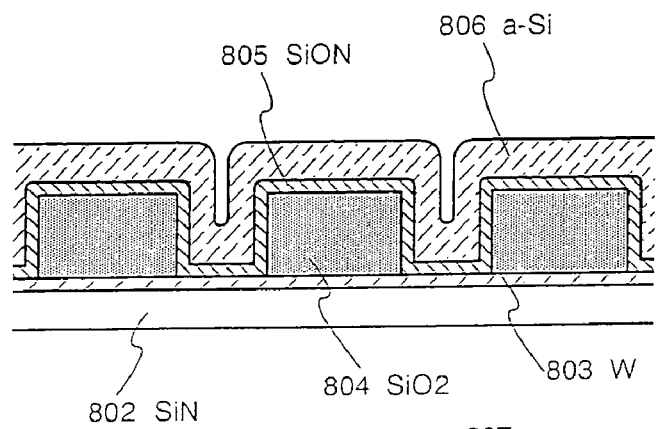
FIG. 29A
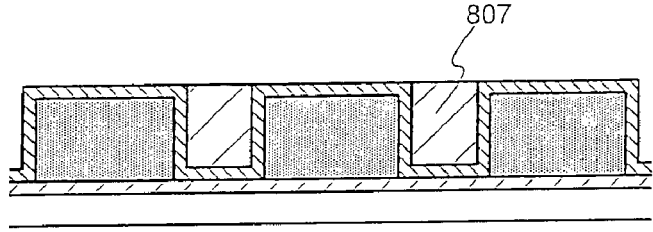
FIG. 29B
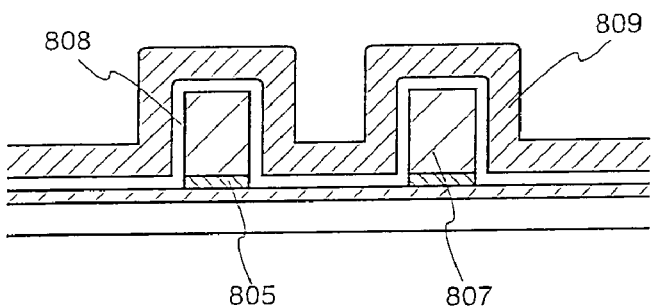
FIG. 29C
FIG. 30
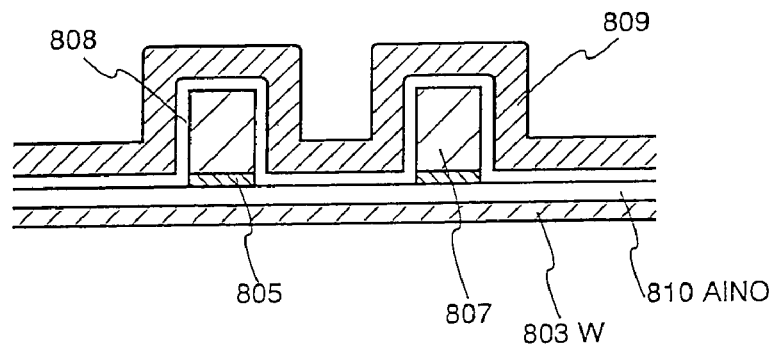

1: concave portion, 2: convex portion
3: semiconductor film, 4: exposed portion of base insulating film,
5: crack by Secco etching (crystal grain boundary)

1.8μm  1.8μm

1: concave portion, 2: convex portion
3: semiconductor film, 4: exposed portion of base insulating film,
5: crack by Secco etching (crystal grain boundary)

semiconductor film, concave portion, convex portion, quartz substrate, first insulating film, second insulating film, third insulating film

SEMICONDUCTOR DEVICE HAVING INSULATING STRIPE PATTERNS

BACKGROUND OF THE INVENTION

1. Field of the Invention

The present invention relates to a semiconductor device formed by using a semiconductor film having a crystalline structure, and to a method of manufacturing the semiconductor device. In particular, the present invention relates to a semiconductor device containing a field effect transistor in which a channel forming region is formed by a crystalline semiconductor film formed on an insulating surface, and to a method of manufacturing the semiconductor device.

2. Description of the Related Art

Techniques of forming an amorphous silicon film on an insulating substrate such as glass, crystallizing the amorphous silicon film, and then forming semiconductor elements such as transistors have been developed. In particular, techniques of crystallizing amorphous silicon films by irradiating laser light have been applied to techniques of manufacturing thin film transistors (TFTs). Transistors manufactured by using a semiconductor film having a crystalline structure (crystalline semiconductor film) are applied to liquid crystal display devices, typically flat surface type display devices (flat panel displays).

The application of laser light in semiconductor manufacturing processes has developed in techniques of recrystallizing damaged layers and amorphous layers formed in a semiconductor substrate or a semiconductor film, and techniques of crystallizing an amorphous semiconductor film formed on an insulating surface. A suitable laser oscillator apparatuses normally use a gas laser, typically an excimer laser, or a solid state laser, typically a YAG laser.

An example of crystallizing an amorphous semiconductor film by laser light irradiation is polycrystallization as disclosed in JP 62-104117 A, in which the laser light scanning speed is at high speed, equal to or greater than the beam spot size×5000/sec, and the amorphous semiconductor film thus does not reach a completely melted state. A technique of effectively forming a single crystal region by irradiating elongated laser light to a semiconductor film formed into an island shape is disclosed in U.S. Pat. No. 4,330,363. Alternatively, a method is known for processing laser light into a linear shape beam by using an optical system and then irradiating the beam, as in a laser processing apparatus disclosed in JP 8-195357 A.

In addition, a technique for manufacturing a transistor by irradiating the second harmonic of laser light, emitted using a solid state laser apparatus such as an Nd:YBO$_4$ laser, to an amorphous semiconductor film, thus forming a crystalline semiconductor film having a large grain size compared to conventional crystalline semiconductor films, is disclosed in JP 2001-144027 A.

However, polycrystals result if crystallization is performed by irradiating laser light to an amorphous semiconductor film formed on a level surface, defects such as crystal grain boundaries are formed arbitrarily, and crystals with aligned orientation cannot be obtained.

Grain boundaries are included as crystal defects, and the crystal grain boundaries become carrier traps, and causes for lowering the mobility of electrons or holes. Furthermore, semiconductor films in which distortions and crystal defects do not exist cannot be formed because of volumetric contraction of the semiconductor film, thermal stress with a base, lattice mismatching, and the like that accompany upon crystallization. Unless otherwise using a particular method in which a laminated SOI (silicon on insulator) is used, it has not been possible to obtain a quality equivalent to that of a MOS transistor, which is formed on a single crystal substrate, in a crystalline semiconductor film that is formed on an insulating surface and then crystallized or recrystallized.

The aforementioned flat panel display devices and the like have built-in transistors in which a semiconductor film is formed on a glass substrate, but it is nearly impossible to dispose the transistors so as to avoid arbitrarily formed grain boundaries. That is, unintentionally included crystal grain boundaries and crystal defects have not been able to be excluded by strictly controlling the crystallinity of transistor channel forming regions. In short, not only do the electrical characteristics of the transistor degrade, but also this becomes a cause of dispersion in the characteristics of individual elements.

SUMMARY OF THE INVENTION

In view of the above-mentioned problems, an object of the present invention is to provide a semiconductor device constructed by semiconductor elements or semiconductor element groups which are capable of high speed operation, have high current driver performance, and have little dispersion between a plurality of the semiconductor elements or element groups, by forming a crystalline semiconductor film in which crystal grain boundaries do not exist, at minimum, in channel forming regions.

In order to resolve the above-mentioned problems, in the present invention, an insulating film having an uneven portion extending in a straight line stripe pattern is formed on a substrate having an insulating surface; a convex (projection) portion of the insulating film that intersects with a crystalline semiconductor film, which is divided into an island shape and which is a structural material for semiconductor elements such as transistors, is removed, after which an amorphous semiconductor film is formed on the insulating film; the semiconductor film is melted, flows into a concave (depression) portion of the insulating film, and crystallized, thus forming a crystalline semiconductor film; the crystalline semiconductor film remaining on the convex portion of the insulating film is removed, after which unnecessary regions are removed by etching, thus forming the crystalline semiconductor film divided into an island shape from the crystalline semiconductor film formed in the concave portion; the convex portion of the insulating film is removed in at minimum a region for forming a channel forming region, thus exposing a side surface portion of the crystalline semiconductor film; and a gate insulating film that contacts the side surface portion and an upper surface portion of the crystalline semiconductor film, and a gate electrode are formed.

The concave portion may be formed by a direct etching process performed on the surface of an insulating substrate, and the concave portion may also be formed by performing an etching process on a silicon oxide film, a silicon nitride film, a silicon oxynitride film, or the like. The concave portion is formed in alignment with semiconductor elements, in particular with the disposal of the island shape semiconductor film containing transistor channel forming regions, and it is preferable to form the concave portion so that it, at minimum, conforms with the channel forming region. Furthermore, the concave portion is formed extending in a channel longitudinal direction. The width of the concave portion (channel width direction when making a channel forming region) is formed greater than or equal to 0.01 μm and smaller than or equal to 2 μm, preferably from 0.1 to 1 μm, and the depth of the concave portion is formed greater than or equal to 0.01 μm and smaller than or equal to 3 µm, preferably greater than or equal to 0.1 µm and smaller than or equal to 2 µm.

The semiconductor film formed on the insulating film and on the concave portion applies an amorphous semiconductor film or a polycrystalline semiconductor film formed by plasma CVD, sputtering, or low pressure CVD, a polycrystalline semiconductor film formed by solid state growth, or the like in a first stage. Note that the term amorphous semiconductor film as used by the present invention not only includes its strict definition of films having a completely amorphous structure, but also includes states containing microscopic crystal grains, so-called microcrystalline semiconductor films, and semiconductor films containing a localized crystal structure. Typically an amorphous silicon film is applied, and in addition, amorphous silicon germanium films, amorphous silicon carbide films, and the like can also be applied. Further, the term polycrystalline semiconductor film denotes these films crystallized by a known method.

Pulse wave or continuous wave laser light that uses a gas laser oscillator apparatus or a solid state laser oscillator apparatus as a light source is applied as a means of melting a crystalline semiconductor film and performing crystallization. The laser light irradiated is condensed into a linear shape by using an optical system. The intensity distribution of the laser light has a uniform region in a longitudinal direction, and may possess a distribution in a transverse direction. The laser oscillator apparatus used as the light source applies a rectangular beam solid state oscillator apparatus, and in particular, preferably applies a slab laser oscillator apparatus. Alternatively, a solid state laser oscillator apparatus that uses a rod doped with Nd, Tm, and Ho, in particular a combination of a solid state laser oscillator apparatus that uses crystals such as YAG, $YVO_4$, YLF, or $YAlO_3$ doped with Nd, Tm, and Ho, and a slab structure amplifier may also be employed. Crystals such as Nd:YAG, Nd:GGG (gadolinium, gallium, garnet), and Nd:GsGG (gadolinium, scandium, gallium, garnet) may be used as a slab material. The slab laser advances along a zigzag light path while total reflection is repeated within the slab shape laser medium.

Further, strong light conforming to the aforementioned light may also be irradiated. For example, high energy density light emitted from a halogen lamp, a xenon lamp, a high pressure mercury lamp, a metal halide lamp, an excimer lamp and condensed by using a reflecting mirrors, lenses, and the like may be used.

The laser light or strong light that is condensed into a linear shape and expanded in a longitudinal direction is then irradiated to the crystalline semiconductor film, the laser light irradiation position and the substrate on which the crystalline semiconductor film is formed are moved relative to each other, and the crystalline semiconductor film is melted by scanning the laser light over a portion of, or the entire, surface, thus performing crystallization or recrystallization through this melted state. Scanning is performed such that the scanning direction of the laser light is along a longitudinal direction of the concave portion extending in a straight line stripe pattern formed in the insulating film, or along a transistor channel longitudinal direction. Crystals thus grow along the scanning direction of the laser light, and crystal grain boundaries are prevented from intersecting with the channel longitudinal direction.

A semiconductor device of the present invention manufactured as above includes: an insulating surface; a pair of one conductivity type impurity regions on the insulating surface; a straight line shape concave portion connected between the pair of one conductivity type impurity regions; and a crystalline semiconductor film containing a plurality of crystal orientations, without the existence of grain boundaries in a direction parallel to the straight line shape concave portion, on the insulating surface.

According to another structure, a semiconductor device of the present invention includes: an insulating surface; a pair of one conductivity type impurity regions on the insulating surface; a straight line shape concave portion connected between the pair of one conductivity type impurity regions; a crystalline semiconductor film containing a plurality of crystal orientations, without the existence of grain boundaries in a direction parallel to the straight line shape concave portion, on the insulating surface; an insulating layer; and a conductive layer overlapping with the crystalline semiconductor film through the insulating layer, thus forming a channel forming region in the crystalline semiconductor film, in which: the crystalline semiconductor film in the channel forming region is from 0.01 µm to 2 µm, preferably from 0.1 µm to 1 µm, in a channel width direction; and the crystalline semiconductor film in the channel forming region has a thickness of 0.01 µm to 3 µm. A characteristic embodiment of the channel forming region is a structure in which the semiconductor device of the present invention includes a gate electrode overlapping with the crystalline semiconductor film through an insulating film covering a side surface portion and an upper surface portion thereof, thus forming a channel forming region in the side surface portion and the upper surface portion of the crystalline semiconductor film. One, or a plurality of, such channel forming regions are provided between the pair of one conductivity type impurity regions.

Further, a structure in which a crystalline semiconductor film is formed on a metal layer formed on a glass or quartz substrate and containing one element, or a plurality of elements, selected from the group consisting of W, Mo, Ti, Ta, and Cr, and an insulating layer is formed intervening between the metal layer and the crystalline semiconductor film, may also be used as another structure. Alternatively, a structure in which a metal layer containing an element, or a plurality of elements, selected from the group consisting of W, Mo, Ti, Ta, and Cr is formed on a glass or quartz substrate, an insulating layer made from aluminum nitride or aluminum oxynitride is formed on the metal layer, and a crystalline semiconductor film is formed on the insulating layer may also be used. The metal layer formed here can function as a light shielding film for shielding light made incident to the channel forming region, and can impart a specific electric potential, thus controlling a fixed electric charge and depletion layer expansion. Further, the metal layer can also be imparted with a function as a radiator sheet for releasing joule heat.

The semiconductor melted by laser light or strong light irradiation aggregates in the concave portion due to surface tension by setting the depth of the concave portion on the same order as, or greater than, the thickness of the semiconductor film. The thickness of the semiconductor film in convex portions of the insulating film becomes thinner, and stress and strain can be concentrated in those locations. Further, side surfaces of the concave portion are effective to a certain extent in prescribing the crystal orientation. The angle of the side surfaces of the concave portion with respect to the substrate surface is set from 5 to 120°, preferably from 80 to 100°. Growth takes place along the convex portion extending in a direction parallel to the channel longitudinal direction, with a preferred orientation of <110> or <100>, by scanning the laser light along that direction.

The semiconductor in a melted state can be made to aggregate in the concave portion formed on the insulating surface due to surface tension, and distortions generated along with crystallization, due to crystal growth from roughly the intersections of bottom portions and side surface portions of the concave portion, can be made to concentrate in regions outside of the concave portion. In other words, the crystalline semiconductor film formed so as to fill the concave portion can be freed from deformations. The crystalline semiconductor film that remains on the insulating film and contains crystal grain boundaries and crystal defects is then removed by etching.

In accordance with the present invention, it becomes possible to specify locations for semiconductor elements such as transistor, in particular transistor channel forming regions, and to form a crystalline semiconductor film, which does not contain crystal grain boundaries, at those locations. A cause leading to dispersion in characteristics due to crystal grain boundaries and crystal defects existing inadvertently can thus be eliminated, and transistors or transistor groups can be formed having little dispersion in their characteristics.

Further, the surface area of the channel forming region can be enlarged, and the on current can be increased, by forming a gate insulating film and a gate electrode overlapping with the side surface portions and upper surface portions of the crystalline semiconductor film. In addition, by applying a gate voltage from three directions, carriers injected to the gate insulating film, in particular hot carriers, can be reduced, and transistor reliability can be increased.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the accompanying drawings:

FIGS. 5A to 5E are longitudinal cross sectional diagrams for explaining in detail the relationship between the shape of an opening portion during crystallization and the form of a crystalline semiconductor film;

FIGS. 17A and 17B are diagrams for explaining laser light condensed into a linear shape, and the scanning direction of the laser light, respectively, in the present invention;

FIGS. 18A and 18B are cross sectional diagrams for explaining the process of manufacturing a transistor manufactured in accordance with the present invention;

FIG. 19 is a longitudinal cross sectional diagram for explaining in detail a channel forming region of a transistor manufactured in accordance with the present invention;

FIGS. 28A and 28B are longitudinal cross sectional diagrams for explaining the structure of a pixel portion corresponding to FIG. 21;

FIGS. 29A to 29C are longitudinal cross sectional diagrams for explaining in detail a channel forming region of a transistor manufactured in accordance with the present invention, in which a metal film is formed on a base;

FIG. 30 is a longitudinal cross sectional diagram for explaining in detail a channel forming region of a transistor manufactured in accordance with the present invention, in which a metal film is formed on a base;

DETAILED DESCRIPTION OF THE PREFERRED EMBODIMENTS

Embodiment 1

Figure 1:
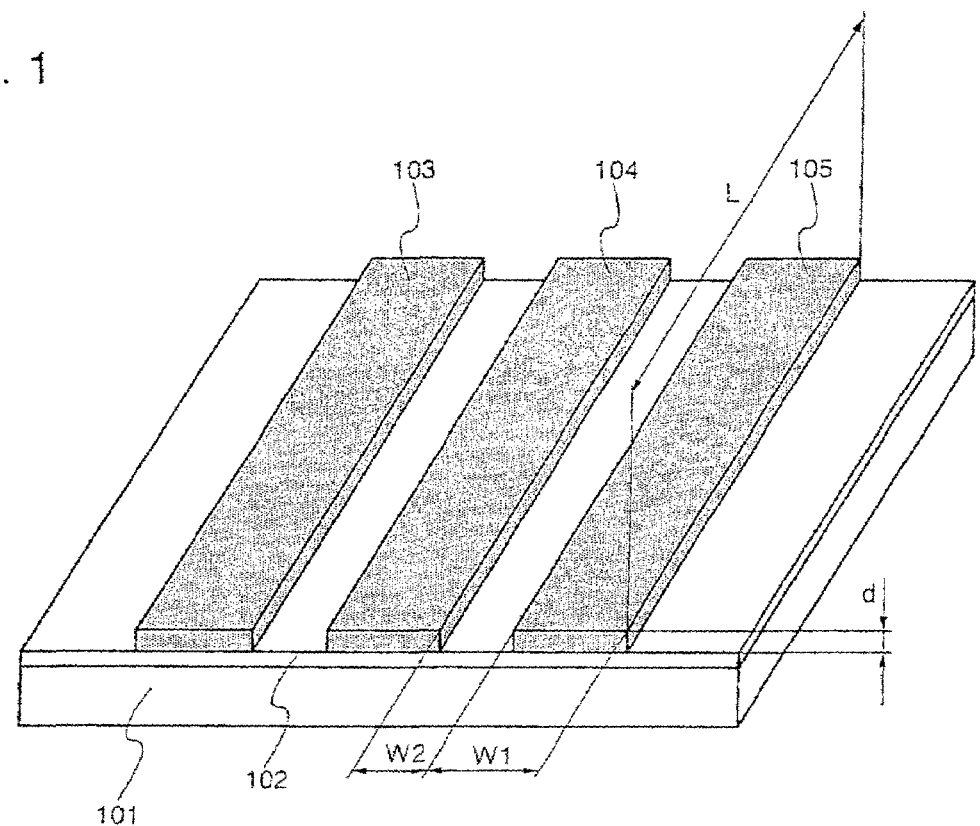
FIG. 1 is a perspective view for explaining a crystallization method of the present invention, and shows a stage at which concave portions are formed by using an insulating film.

An embodiment of the present invention is explained below while referring to the drawings. A perspective view shown in FIG. 1 shows an embodiment in which a first insulating film 102, and second insulating films 103 to 105 formed in a straight line stripe pattern, are formed on a substrate 101. Although three stripes of the straight line stripe pattern formed by the second insulating films are shown in FIG. 1, of course there are no limitations placed on the number of stripes.

The substrate can apply a commercially available non-alkaline glass substrate, quartz substrate, sapphire substrate, substrates in which a surface of a single crystal or polycrystalline semiconductor substrate is covered by an insulating film, and substrates in which a surface of a metal substrate is covered by an insulating film. It is necessary to make unevenness on the substrate surface, and waviness and twisting of the substrate, equal to or smaller than the focal depth of an exposure apparatus (in particular, a stepper) in order to form a straight line stripe pattern under a sub-micron design rule. Specifically, it is preferable that waviness and twisting of the substrate be equal to or smaller than 1 μm within a region irradiated one time by exposure light, and more preferably equal to or smaller than 0.5 μm.

A width W1 of the second insulating films formed in a straight line stripe pattern is from 0.1 to 10 μm (preferably from 0.5 to 1 μm), a gap W2 between adjacent second insulating films is from 0.01 to 2 μm (preferably from 0.1 to 1 μm), and a thickness d of the second insulating films is from 0.01 to 3 μm (preferably from 0.1 to 2 μm). Further, it is not necessary that the step shape be a regular periodic pattern, and it may also be arranged at a predetermined spacing aligned with the width of island shape semiconductor films. There are also no limitations placed on a length L of the step shape. A length on an order such that a transistor channel forming region can be formed, for example, may be employed.

The first insulating film is formed at a thickness of 30 to 300 nm by using a material selected from the group consisting of silicon nitride, silicon oxynitride in which the amount of nitrogen contained is greater than the amount of oxygen contained, aluminum nitride and aluminum oxynitride. The second insulating film, in which a concave portion is formed having a predetermined shape, is formed by using silicon oxide or silicon oxynitride at a thickness of 10 to 3000 nm, preferably from 100 to 2000 nm. Silicon oxide can be formed by plasma CVD using a mixture of tetraethyl orthosilicate (TEOS) and $O_2$. A silicon oxynitride film can be formed by plasma CVD using $SiH_2$, $NH_3$, and $N_2O$, or $SiH_4$ and $N_2O$ as raw materials.

It is necessary for selectivity between the first insulating film and the second insulating films in etching when forming the straight line stripe pattern by using a two layer insulating film as shown by FIG. 1. In practice, it is preferable to suitably regulate the materials and film formation conditions so that the etching speed of the second insulating films is relatively faster than that of the first insulating film. Etching by using buffered hydrofluoric acid, or dry etching by using $CHF_3$ is performed as an etching method. The angle of a side surface portion of the concave portions formed by the second insulating films may be suitably set in a range from 5 to 120 degrees, preferably from 80 to 100 degrees.

Figure 2:
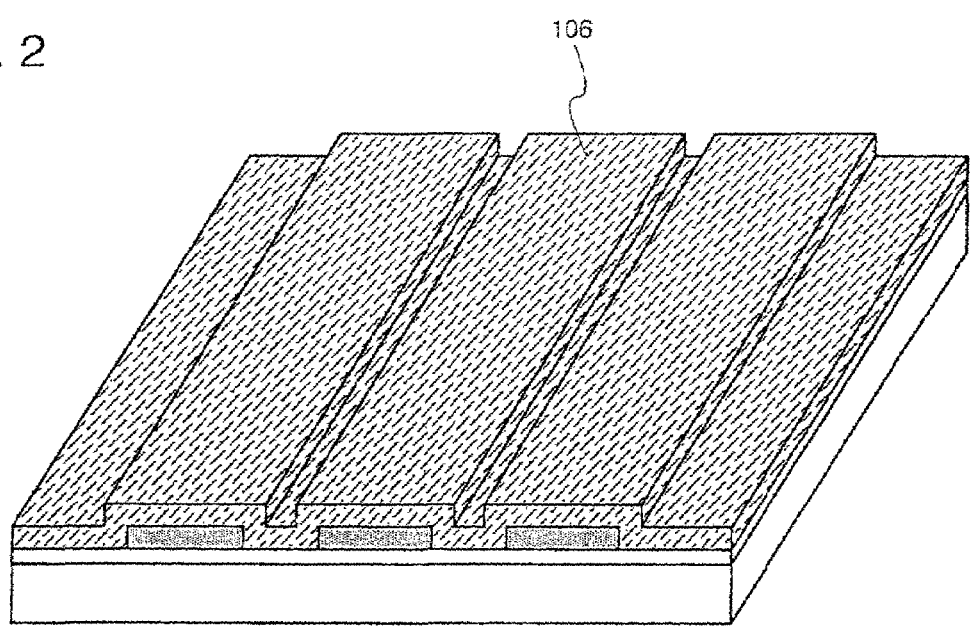
FIG. 2 is a perspective view for explaining a crystallization method of the present invention, and shows a stage at which an amorphous semiconductor film is formed on the insulating film in which the concave portions are formed.

An amorphous semiconductor film 106 having a thickness of 0.01 to 3 μm (preferably from 0.1 to 1 μm) is formed as shown by FIG. 2, covering the surface and the concave portion made from the first insulating film 102 and the second insulating films 103 to 105. That is, it is preferable to form the amorphous semiconductor film at a thickness on the same order as, or greater than, the depth of the concave portion. The amorphous semiconductor film can apply silicon, a chemical compound or alloy of silicon and germanium, or a chemical compound or alloy of silicon and carbon.

As shown in the figure, the amorphous semiconductor film is formed so as to cover an uneven structure formed by the first insulating film and the second insulating films of a base. Further, a silicon oxynitride film may also be formed in succession within the same film formation apparatus, without being exposed to the external atmosphere, as a third insulating film on a low layer side of the amorphous semiconductor film in order to eliminate any influence of chemical contamination such as boron adhering to the surface of the first insulating film and the second insulating films, and so that the insulating surface and the amorphous semiconductor film do not come into direct contact with each other.

The amorphous semiconductor film 106 is then instantaneously melted and crystallized. The crystallization is performed by concentrating laser light, or light irradiated from a lamp light source, by using an optical system to such an energy density that the semiconductor film will melt. In particular, it is preferable to apply laser light having a continuous wave laser oscillator apparatus as a light source in this process. The laser light applied is condensed into a linear shape, and expanded in a longitudinal direction, by an optical system, and has a region in the longitudinal direction wherein the intensity distribution of the laser light is uniform. It is preferable that the laser light be given a distribution in a lateral direction.

The laser oscillator apparatus applies a rectangular beam solid state laser oscillator apparatus, in particular a slab laser oscillator apparatus. Crystals such as Nd:YAG, Nd:GGG (gadolinium, gallium, garnet), and Nd:GsGG (gadolinium, scandium, gallium, garnet) may be used as a slab material. The slab laser advances along a zigzag light path while total reflection is repeated within the slab shape laser medium. Alternatively, a combination of a solid state laser oscillator apparatus that uses a rod doped with Nd, Tm, and Ho, in particular a solid state laser oscillator apparatus that uses crystals such as YAG, $YVO_4$, YLF, or $YAlO_3$ doped with Nd, Tm, and Ho, and a slab structure amplifier may also be employed. Scanning is then performed in a direction that intersects with the linear shape longitudinal direction, as shown by an arrow in the figure. Note that the term linear shape as used here refers to a shape having a ratio between its longitudinal direction length with respect to its transverse direction length equal to or greater than 10 to 1, respectively.

Further, in consideration of the optical absorption coefficient of the amorphous semiconductor film, it is preferable that the wavelength of the continuous wave laser light be from 400 to 700 nm. Light in this waveband is obtained by extracting the second harmonic or the third harmonic of the fundamental wave by using a wavelength converter element. ADP (ammonium dihydrogenated phosphate), $Ba_2NaNb_5O_{15}$ (barium sodium niobate), CdSe (selenium cadmium), KDP (potassium dihydrogenated phosphate), $LiNbO_3$ (lithium niobate), Se, Te, LBO, BBO, KB5, and the like can be applied as the wavelength converter element. In particular, it is preferable to use LBO. A typical example is to use the second harmonic (532 nm) of an $Nd:YVO_4$ laser oscillator apparatus (fundamental wave 1064 nm). Further, the laser oscillation mode uses a $TEM_{00}$ mode, which is a single mode.

For a case in which silicon is selected as the most suitable material, a region in which its absorption coefficient is from $10^3$ to $10^4$ $cm^{-1}$ is nearly the visible light region. If a substrate having a high transmissivity of visible light is used, such as glass, and an amorphous semiconductor film is formed of silicon having a thickness from 30 to 200 nm, then crystallization can be performed without imparting damage to the base insulating film by irradiating visible light with a wavelength of 400 to 700 nm, thus selectively heating the semiconductor film. Specifically, the penetration distance of 532 nm wavelength light is nearly 100 to 1000 nm with respect to an amorphous silicon film, and inside portions of the amorphous semiconductor film 106 formed at a film thickness of 30 to 200 nm can be sufficiently reached. That is, it is possible to heat from the inside of the semiconductor film, and nearly the entire semiconductor film can be heated uniformly in the laser light irradiation region.

Figure 3:
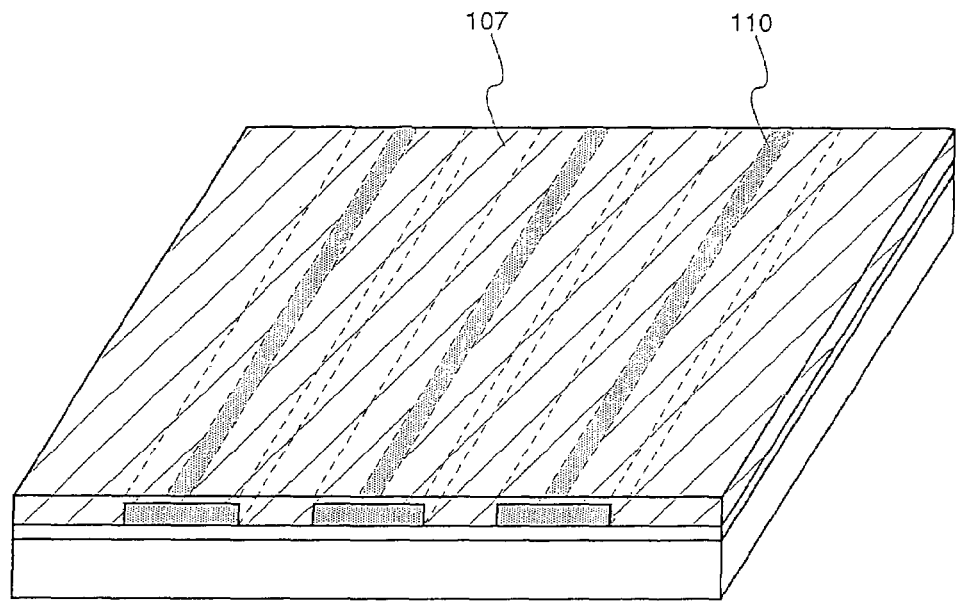
FIG. 3 is a perspective view for explaining a crystallization method of the present invention, and shows a stage at which a crystalline semiconductor is formed on the insulating film in which the concave portions are formed.

Scanning is performed with laser light in a direction parallel to the direction in which the straight line stripe pattern extend. The semiconductor film that has been melted by the laser light irradiation flows into the opening portions (concave portions) due to the action of surface tension and solidifies. The surface is nearly flat in a state thus solidified, as shown by FIG. 3. In addition, crystal growth ends, crystal grain boundaries, and crystal subboundaries are formed on the second insulating films (convex portions, regions 110 denoted by hatch marks in the figure). A crystalline semiconductor film 107 is thus formed.

Heat treatment is then preferably performed at a temperature of 500 to 600° C., thus removing distortions that have accumulated in the crystalline semiconductor film. These distortions are generated due to volumetric shrinkage of the semiconductor, thermal stress with the base, lattice irregularities, and the like that occur during crystallization. This heat treatment process may be performed by using a normal heat treatment apparatus, for example processing may be performed for 1 to 10 minutes by using a gas heating rapid thermal annealing (RTA) method. Note that this process is not an indispensable requirement in the present invention, and may be performed when suitably selected.

Figure 4:
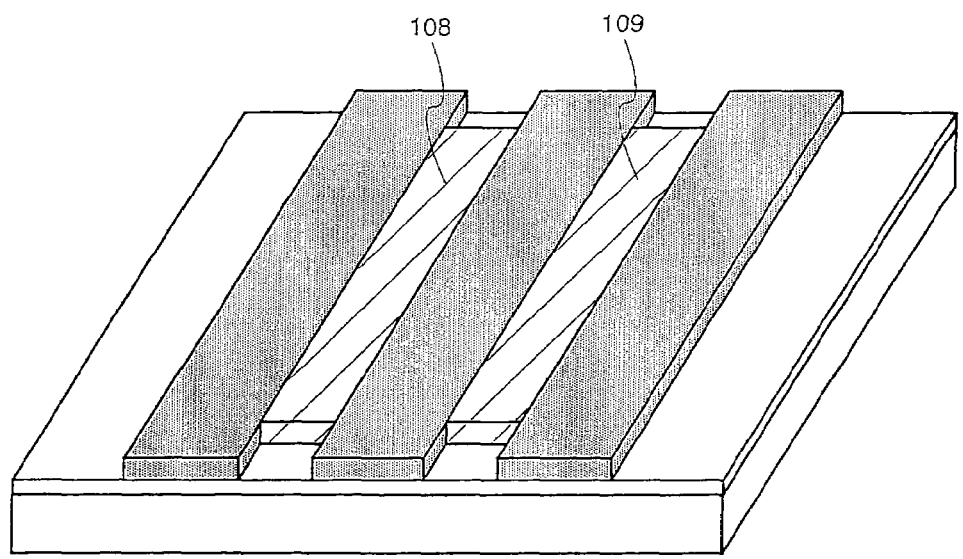
FIG. 4 is a perspective view for explaining a crystallization method of the present invention, and shows a stage at which the crystalline semiconductor film remains in the concave portions.

The surface of the crystalline semiconductor film 107 is then etched, selectively extracting semiconductor regions 108 and 109 that are embedded in the concave regions, as shown in FIG. 4. Only good quality semiconductor regions are allowed to remain by etching and removing the regions 110 in which growth ends, crystal grain boundaries, and crystal subboundaries are concentrated.

The extracted crystalline semiconductor regions 108 and 109 have a plurality of crystal orientations, and crystal grain boundaries are formed. A gate insulating film and gate electrodes are then formed so that channel forming regions of the island shape semiconductor regions 108 and 109 can be prescribed using the crystalline semiconductor films in the concave portions. Transistors can thus be completed through stages like each of these.

FIGS. 5A to 5E are diagrams showing insight into crystallization, obtained from the results of experiments performed by the applicants of the present invention, as schematic diagrams. FIGS. 5A to 5E explain schematically the relationship between the depth of the concave portions formed by the first insulating film and the second insulating films and the gap therebetween, and crystal growth.

Note that reference symbols relating to lengths shown in FIGS. 5A to 5E are as follows: t01 denotes the thickness of the amorphous semiconductor film on the second insulating films (convex portions); t02 denotes the thickness of the amorphous semiconductor films of the concave portions; t11 denotes the thickness of the crystalline semiconductor film on the second insulating films (convex portions); t12 denotes the thickness of the crystalline semiconductor film of the concave portions; d denotes the thickness of the second semiconductor films (depth of the concave portions); W1 denotes the width of the second insulating films; and W2 denotes the width of the concave portions.

FIG. 5A is for a case in which d<t02, and W1 and W2 are on the same order as, or smaller than, 1 μm. If the depth of the concave portion grooves is smaller than amorphous semiconductor film 204, the semiconductor does not fill the concave portions even if it passes through a melting and crystallization process, and the surface of a crystalline semiconductor film 205 does not become sufficiently level. That is, the uneven shape state of the base is reflected in the surface state of the crystalline semiconductor film 205.

FIG. 5B is for a case in which d≧t02, and W1 and W2 are on the same order as, or smaller than, 1 μm. If the depth of the concave portion grooves is nearly equal to, or greater than, an amorphous semiconductor film 203, surface tension acts and there is accumulation in the concave portions. The surface becomes nearly flat as shown in FIG. 5B with a state thus solidified. In this case t11 becomes smaller than t12, stress concentrates in portions 220, which have a thin film thickness on a second insulating film 202, distortions accumulate there, and crystal grain boundaries form.

Figure 31A:
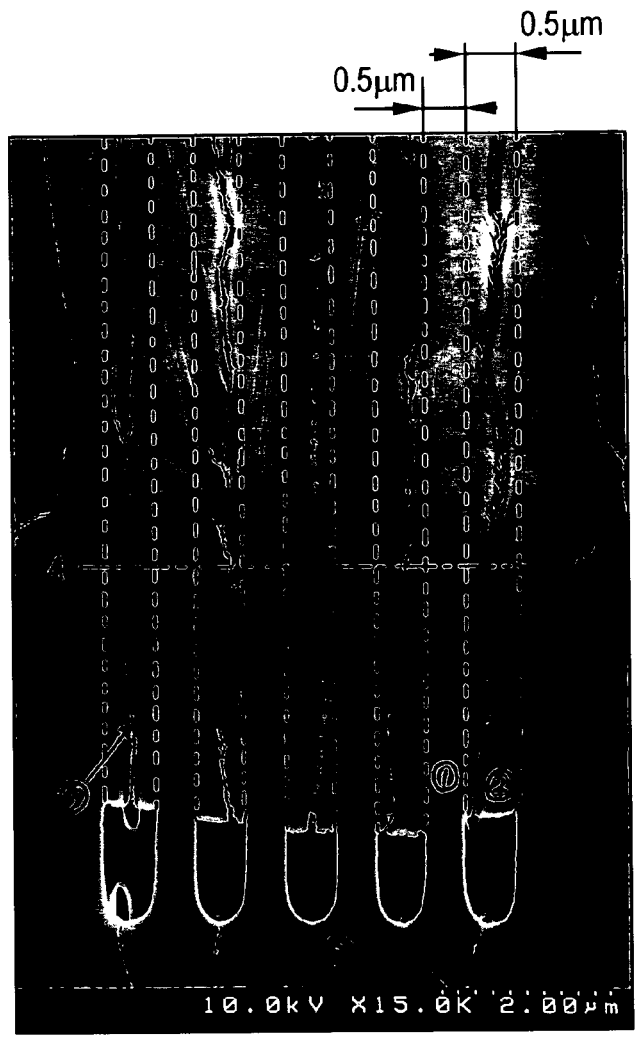
FIG. 31A is a scanning electron microscopy (SEM) photograph (after Secco etching) that shows a surface state when a 170 nm step is formed, a 150 nm amorphous silicon film is formed on a base insulating film, which has convex portions with the gap and width of 0.5 μm, and crystallization is performed.
Figure 31B:
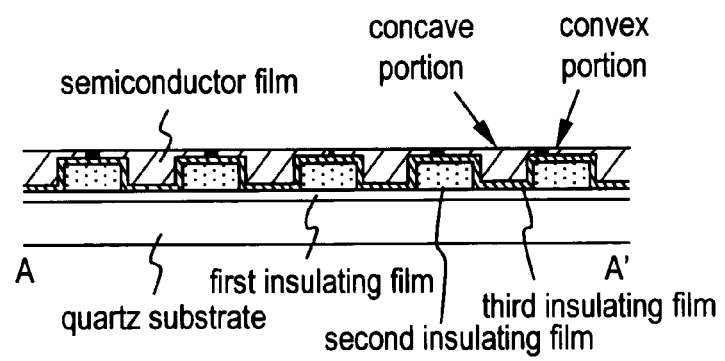
FIG. 31B is a cross sectional view along A-A'.

A scanning electron microscopy (SEM) photograph shown by FIGS. 31A and 31B show an example of such. Results for forming a 170 nm step, forming a 150 nm amorphous silicon film on a base insulating film having convex portions with the gap and width of 0.5 μm, and then crystallizing the amorphous semiconductor film are shown. A surface of the crystalline semiconductor film is etched by using Secco liquid (a prepared chemical solution in which $K_2Cr_2O_7$ is used as an additive for a mixture of HF and $H_2O$ at a ratio of 2:1, respectively) in order to make grain boundaries visible. As this photograph makes clear, the grain boundaries are concentrated in the step shape convex portions.

Figure 32A:
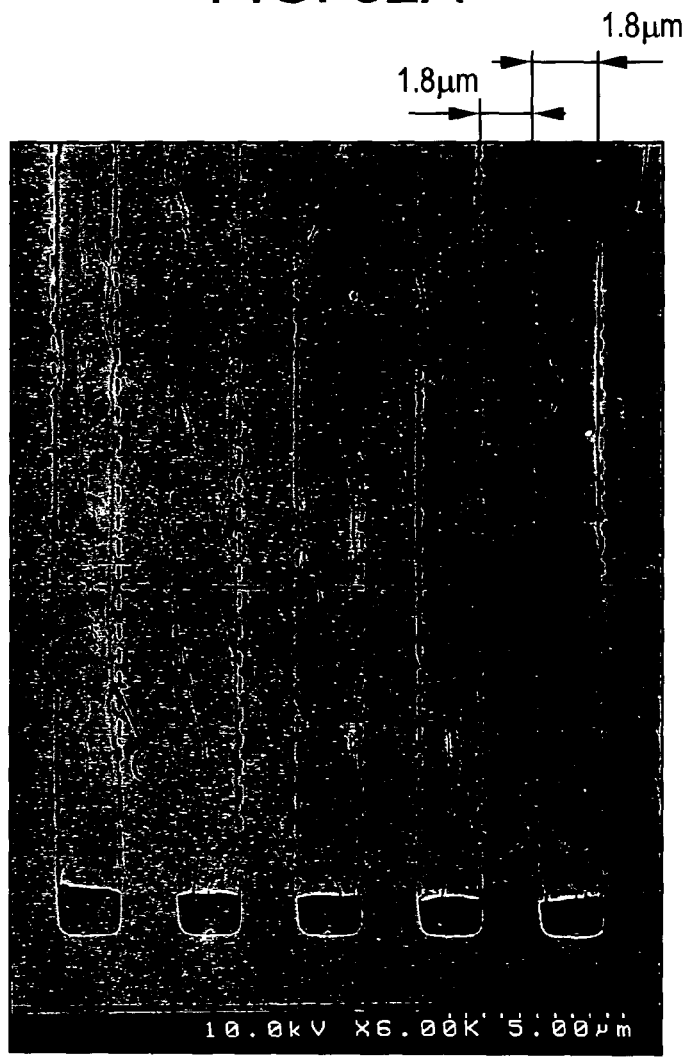
FIG. 32A is a scanning electron microscopy (SEM) photograph (after Secco etching) that shows a surface state when a 170 nm step is formed, a 150 nm amorphous silicon film is formed on a base insulating film, which has convex portions with the gap and width of 1.8 μm, and crystallization is performed.
Figure 32B:
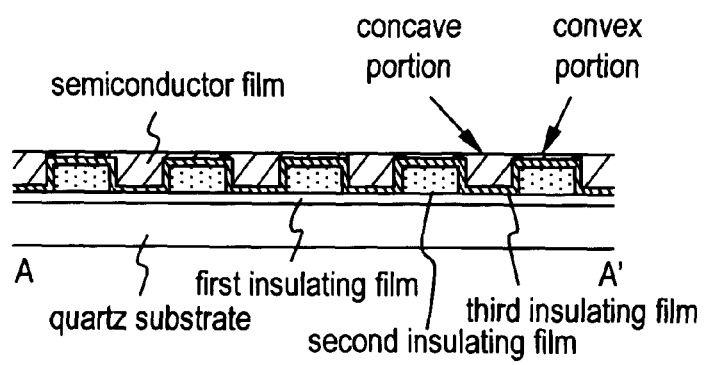
FIG. 32B is a cross sectional view along A-A'.

FIGS. 32A and 32B show results found by electron backscatter diffraction patterning (EBSP) for the orientation of the crystalline semiconductor film formed in the concave portions. EBSP is a method in which a specialized detector is attached to a scanning electron microscopy (SEM), an electron beam is irradiated to crystal surfaces, and image recognition of crystal orientation from Kikuchi lines is performed by computer, thus performing measurements of micro-crystallinity relating to all crystal directions as well as the surface orientation (this method is hereinafter referred to as EBSP for convenience).

The data of FIGS. 32A and 32B show that crystals grow in a direction parallel to the scanning direction of the laser light, which has been condensed into a linear shape, in the concave portions. The plane direction of the growth shows a predominance in the <110> direction, but growth in the <100> direction also exists.

FIG. 5C is for a case in which d>>t02, and W1 and W2 are on the same order as, or smaller than, 1 µm. In this case the crystalline semiconductor film 204 is formed so as to fill the concave portions, and it is possible to make almost none of the crystalline semiconductor film remain on a second insulating film 203.

FIG. 5D is for a case in which d≧t02, and W1 and W2 are on the same order as, or slightly greater than, 1 µm. If the width of the concave portions is expanded, then although the crystalline semiconductor film 205 fills the concave portions and there is a leveling effect, crystal grain boundaries and crystal subboundaries develop near the center of the concave portions. Further, stress similarly concentrates on the second insulating film, distortions accumulate, and crystal grain boundaries are formed. It is conjectured that this is due to the stress relief effect being reduced by the wide gaps.

FIG. 5E is for a case in which d≧t02, and W1 and W2 are greater the 1 µm. The state of FIG. 5D results even more clearly.

Figure 33:
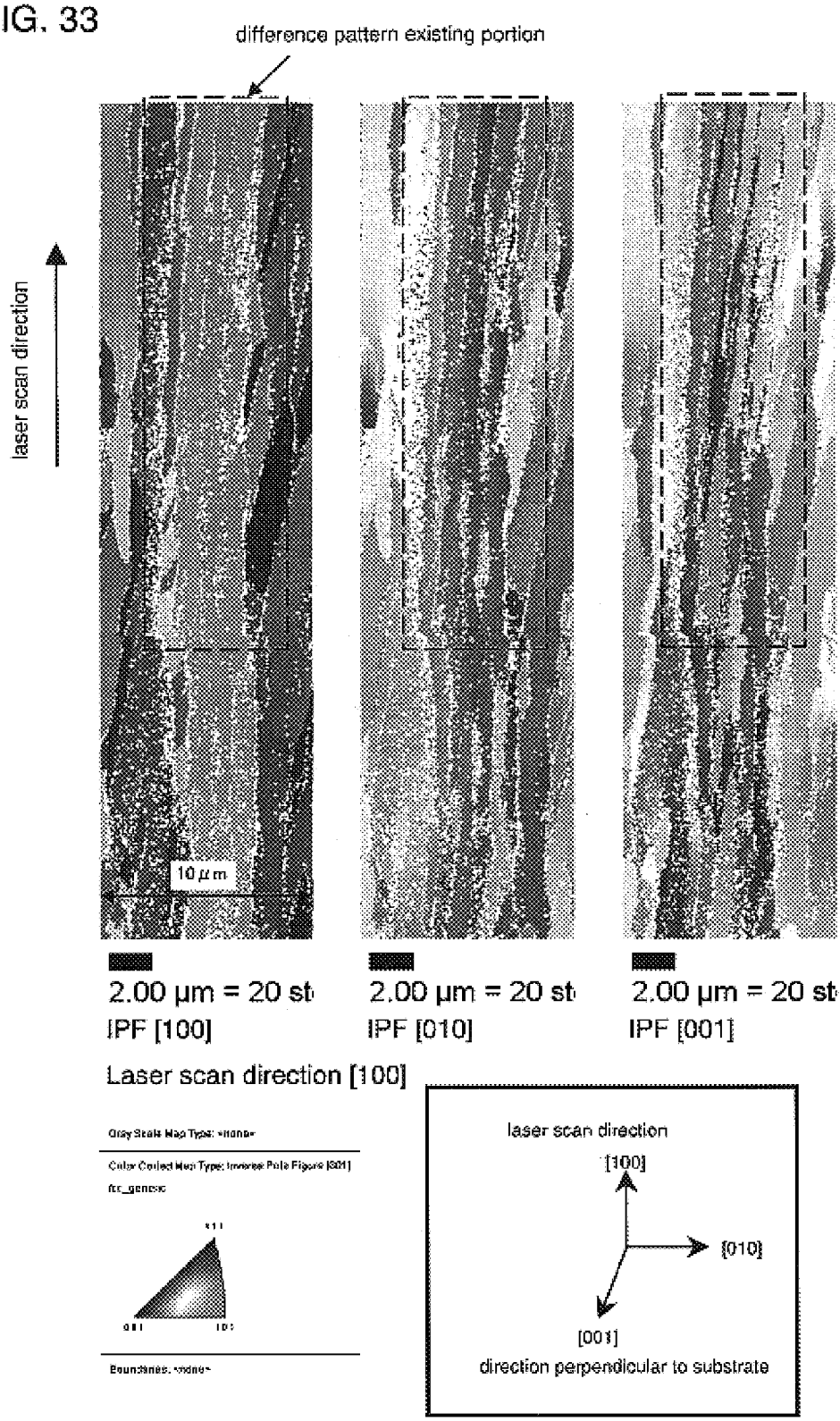
FIG. 33 is EBSP mapping data showing the orientation of crystals formed in a concave portion.

A scanning electron microscopy (SEM) photograph shown by FIG. 33 shows an example of such. Results for forming a 170 nm step, forming a 150 nm amorphous semiconductor film on a base insulating film having convex portions with the gap and width of 1.8 µm, and then crystallizing the amorphous semiconductor film are shown. A surface of the crystalline semiconductor film is etched by using Secco liquid in order to make grain boundaries visible. As is clear by comparing FIG. 33 with FIGS. 31A and 31B, crystal grain boundaries do not exist solely in the step shape convex portions, but also spread out to the concave portions. A crystalline semiconductor film without crystal grain boundaries therefore cannot be selectively removed with this structure.

As explained above using FIGS. 5A to 5E, the conditions of FIG. 5B can be considered the most suitable when forming a semiconductor element, particularly when forming a channel forming region in a transistor by using this type of semiconductor film. Further, although one example is shown in the above explanation for the uneven shape of the base used for forming the crystalline semiconductor film, formed by the first insulating film and the second insulating films, the shape of the base is not limited to the embodiment shown here. Other bases may also be substituted, provided that they have similar shapes. For example, concave portions may be formed directly in the surface of a quartz substrate by etching, thus forming an uneven shape.

Figure 6:
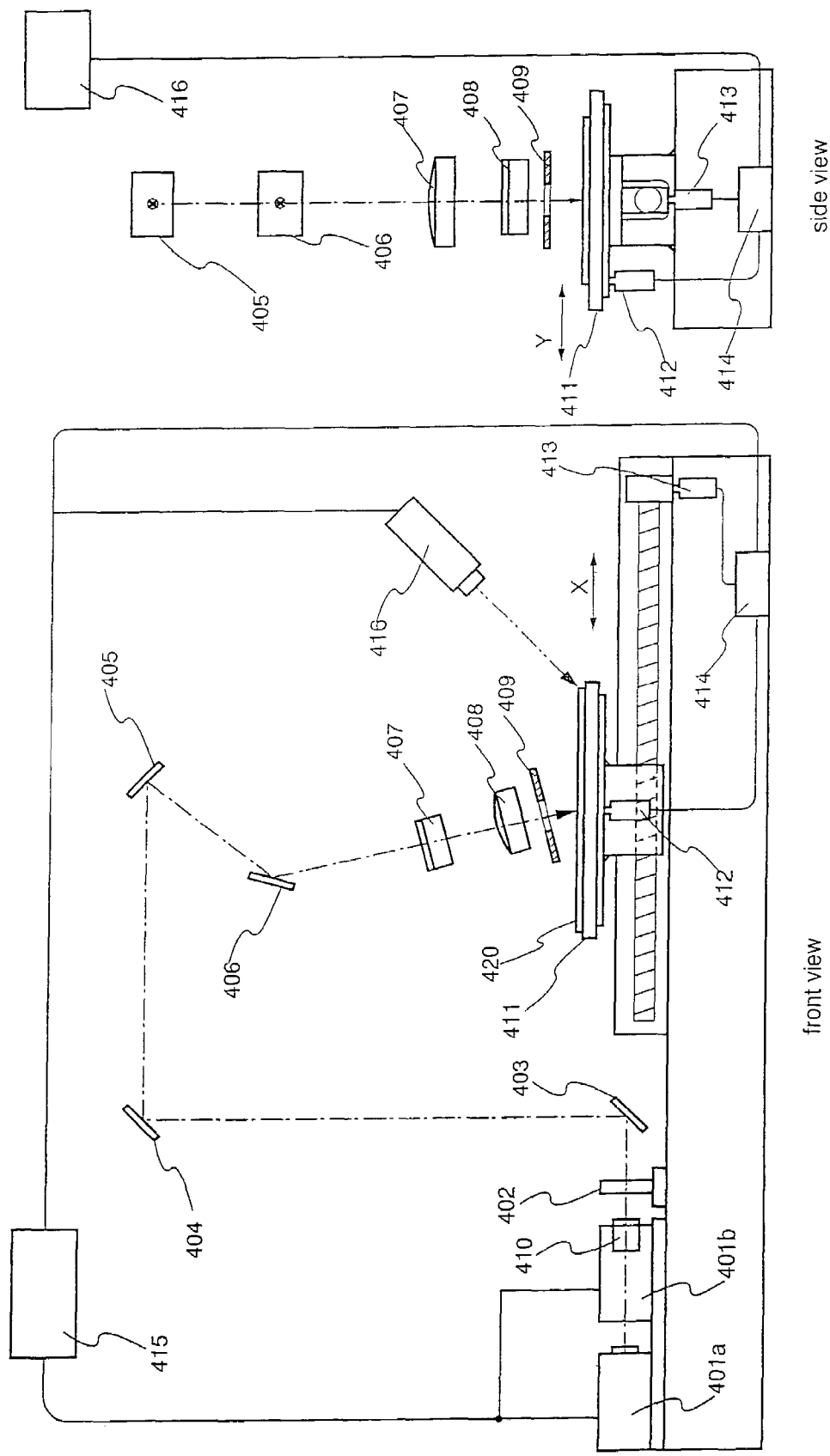
FIG. 6 is a layout diagram showing an embodiment of a laser irradiation apparatus applied in the present invention.
Figure 7A:
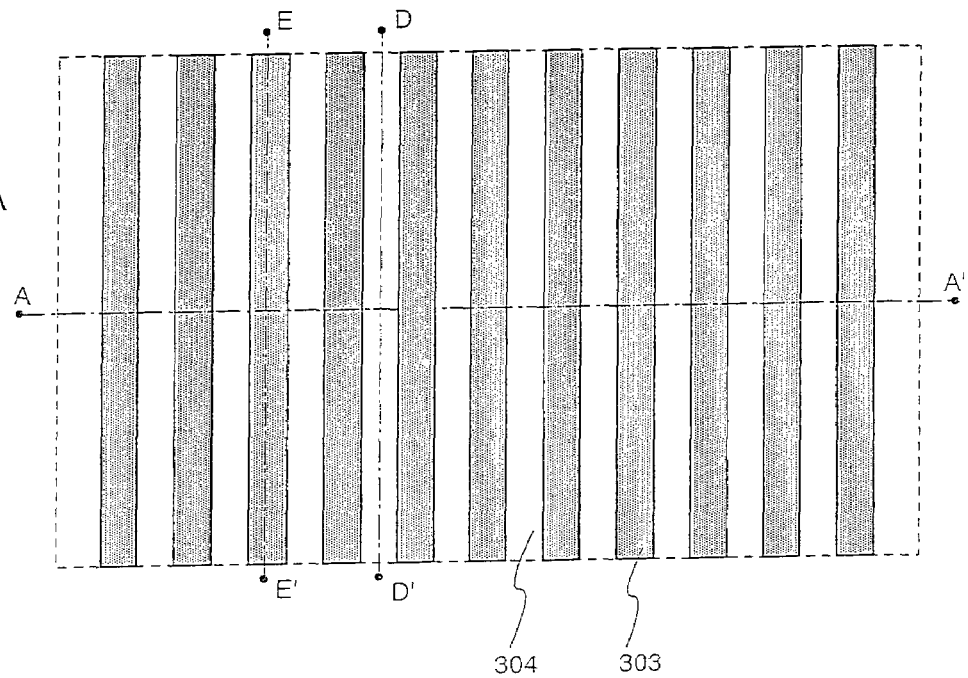
FIGS. 7A to 7D are an upper surface diagram and longitudinal cross sectional diagrams, respectively, for explaining a process of manufacturing a transistor manufactured in accordance with the present invention.
Figure 7B:
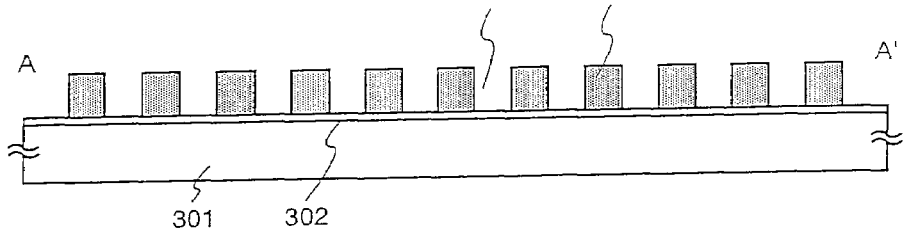
Figure 7C:
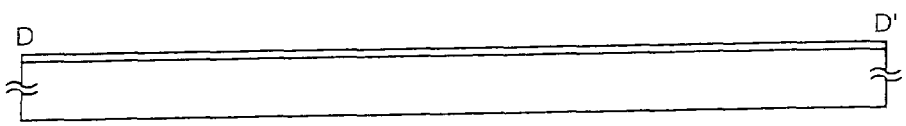
Figure 7D:
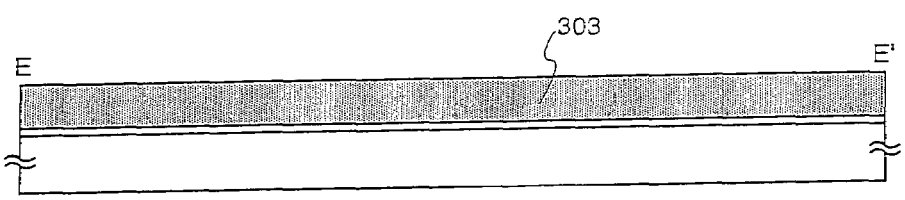
Figure 8A:
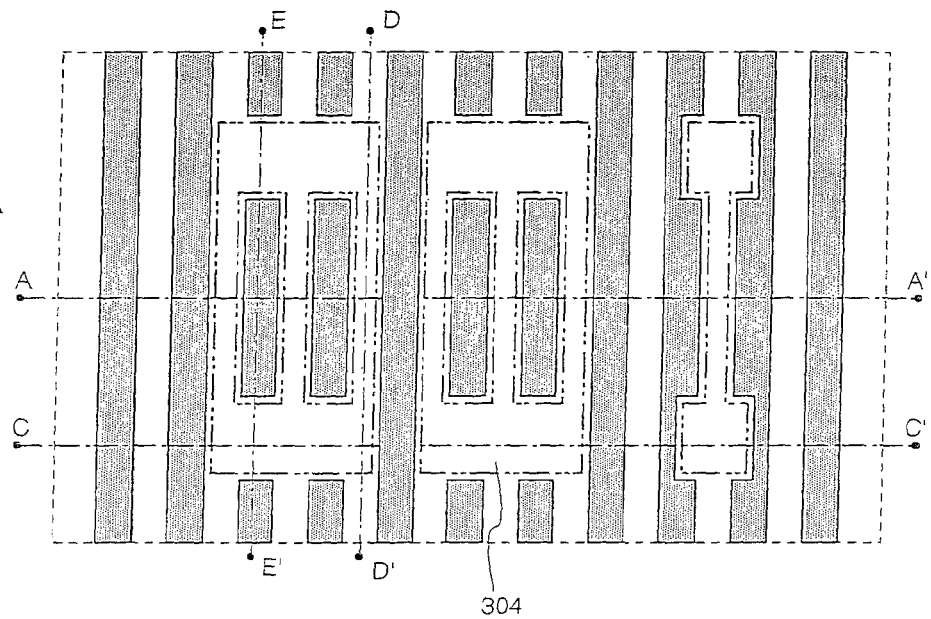
FIGS. 8A to 8E are an upper surface diagram and longitudinal cross sectional diagrams, respectively, for explaining the process of manufacturing a transistor manufactured in accordance with the present invention.
Figure 8B:
Figure 8C:
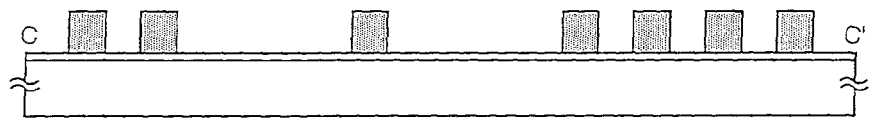
Figure 8D:
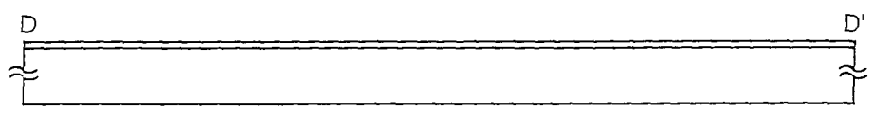
Figure 8E:
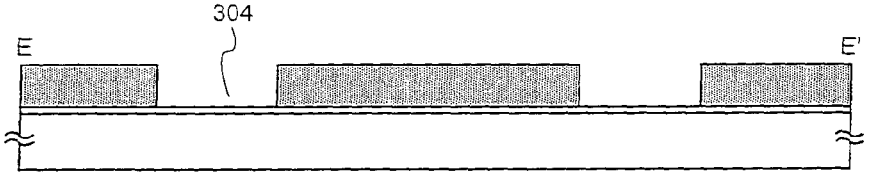
Figure 9A:
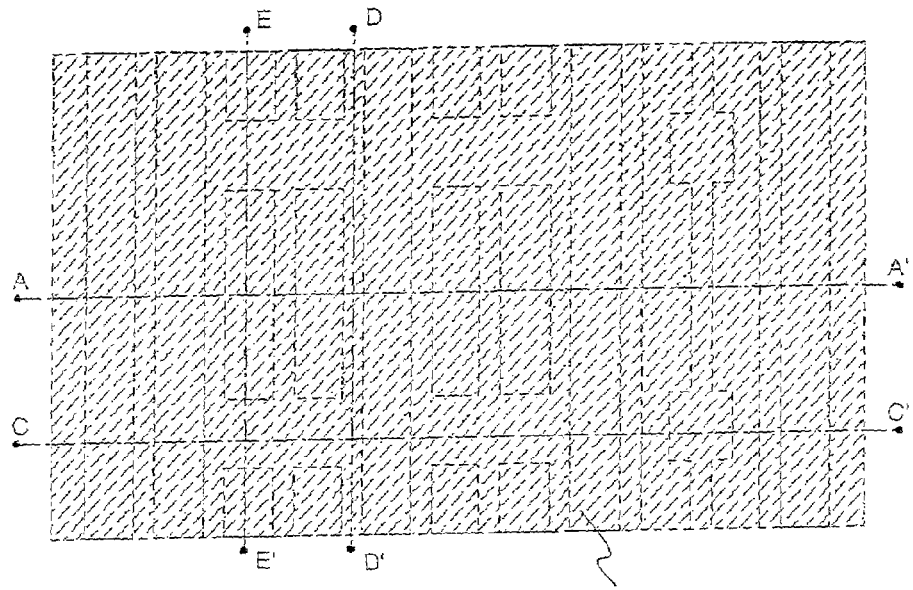
FIGS. 9A to 9E are an upper surface diagram and longitudinal cross sectional diagrams, respectively, for explaining the process of manufacturing a transistor manufactured in accordance with the present invention.
Figure 9B:
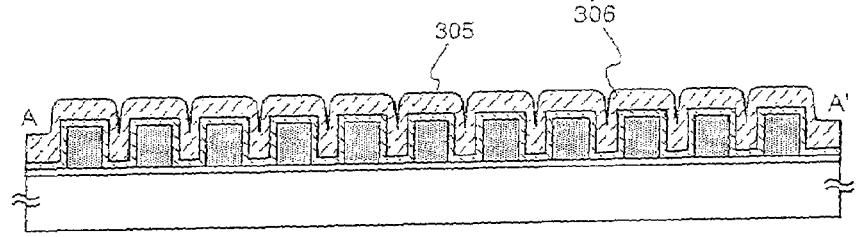
Figure 9C:
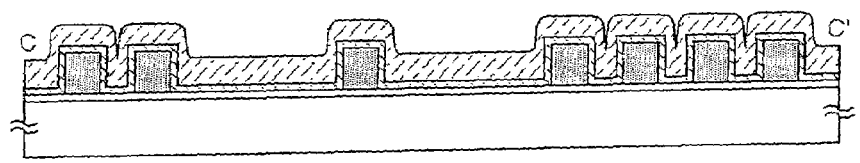
Figure 9D:
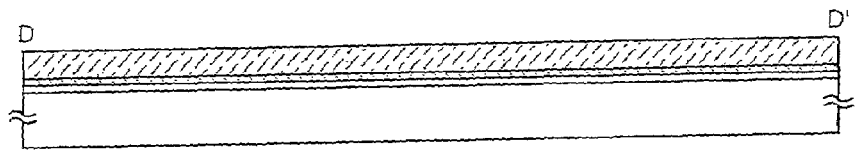
Figure 9E:
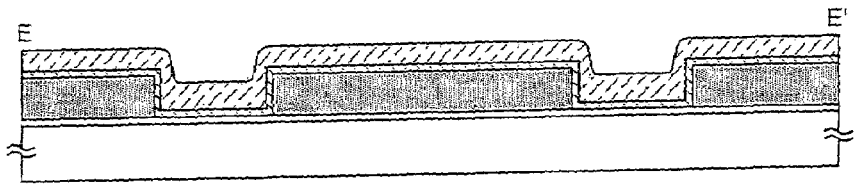
Figure 10A:
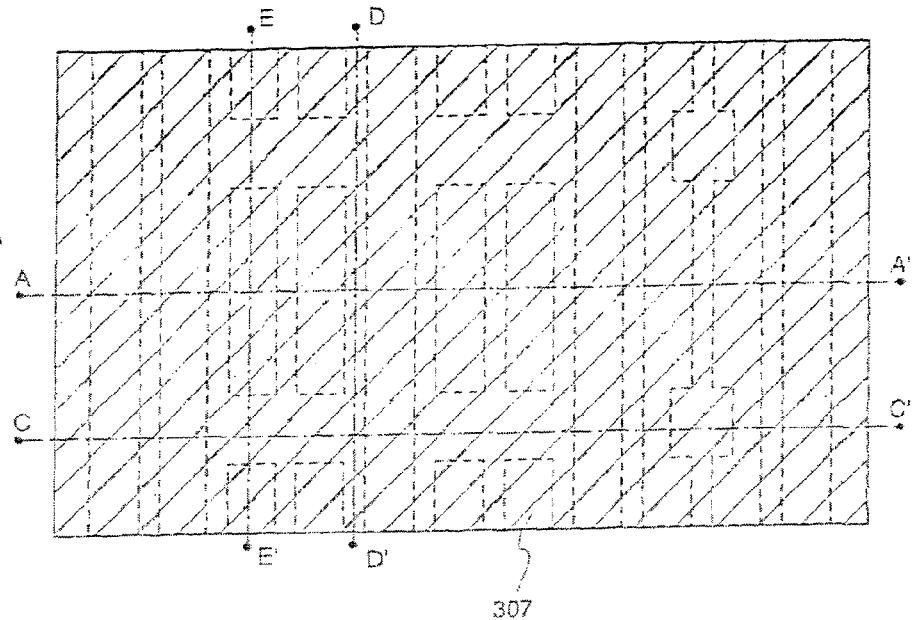
FIGS. 10A to 10E are an upper surface diagram and longitudinal cross sectional diagrams, respectively, for explaining the process of manufacturing a transistor manufactured in accordance with the present invention.
Figure 10B:
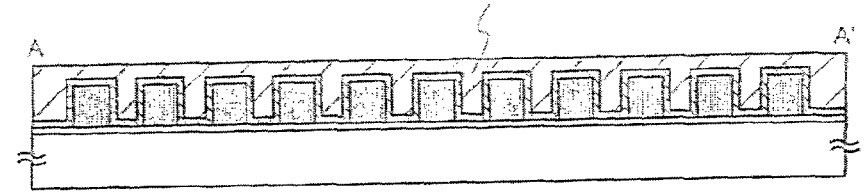
Figure 10C:
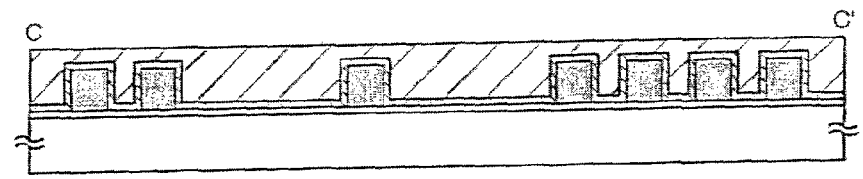
Figure 10D:
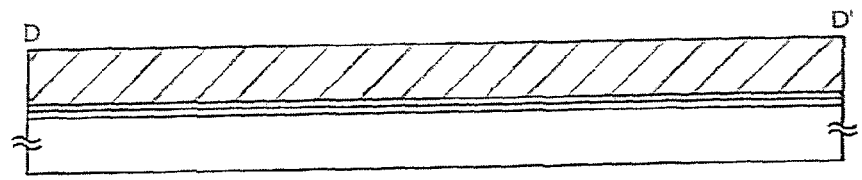
Figure 10E:
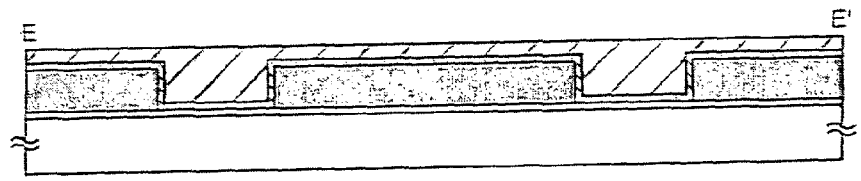
Figure 11A:
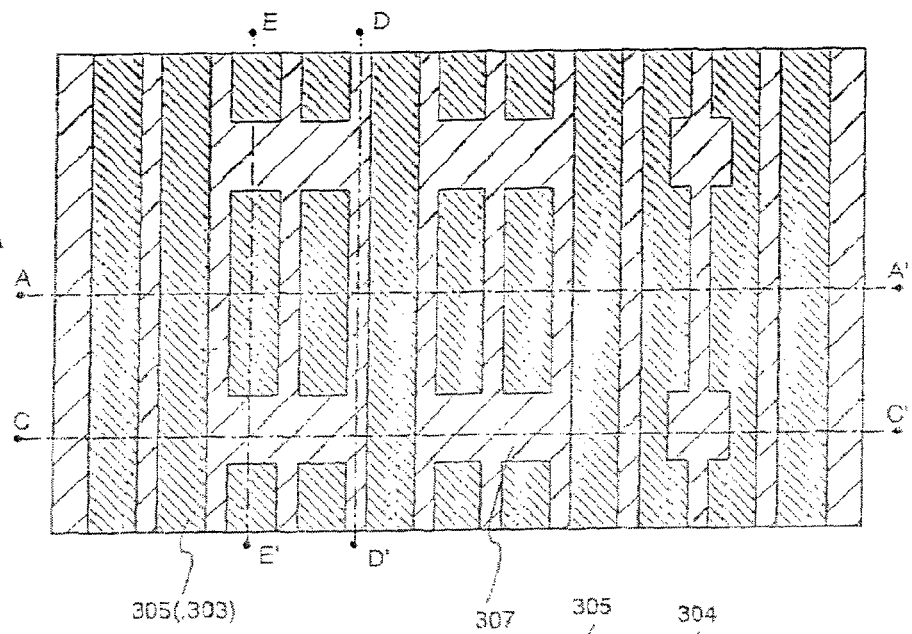
FIGS. 11A to 11E are an upper surface diagram and longitudinal cross sectional diagrams, respectively, for explaining the process of manufacturing a transistor manufactured in accordance with the present invention.
Figure 11B:
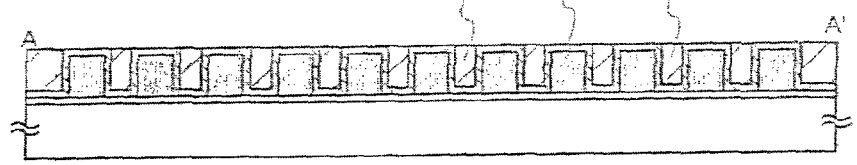
Figure 11C:
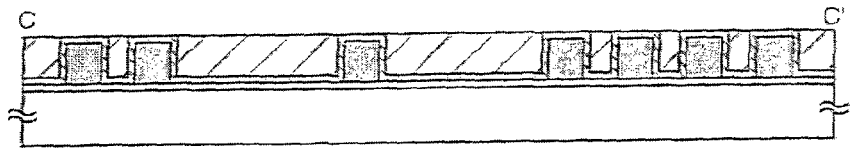
Figure 11D:
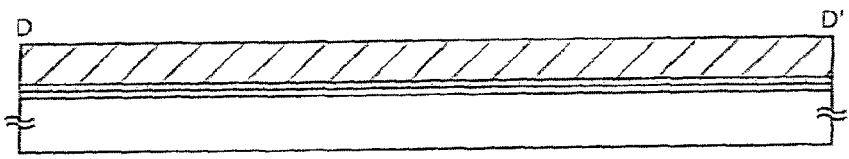
Figure 11E:
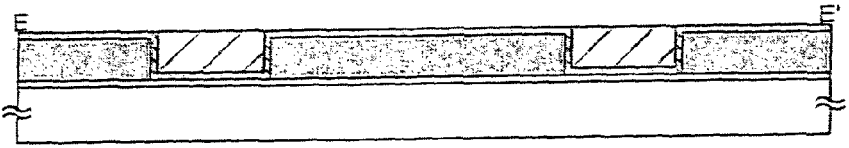
Figure 12A:
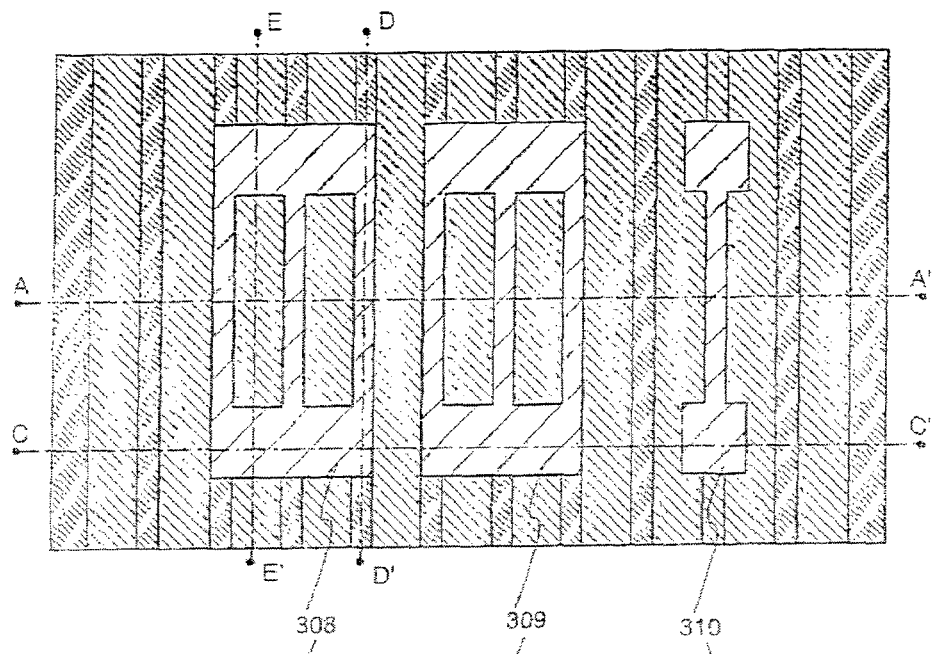
FIGS. 12A to 12E are an upper surface diagram and longitudinal cross sectional diagrams, respectively, for explaining the process of manufacturing a transistor manufactured in accordance with the present invention.
Figure 12B:
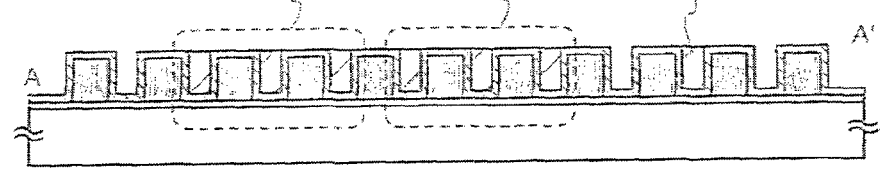
Figure 12C:
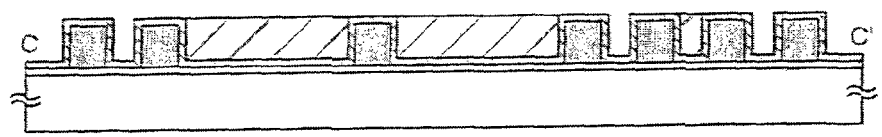
Figure 12D:
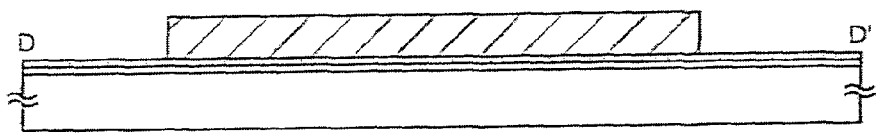
Figure 12E:
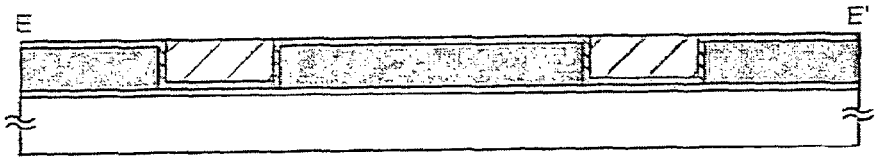

FIG. 6 shows an example of a structure of a laser processing apparatus capable of being applied when performing crystallization. FIG. 6 is a diagram showing a front view and a side view of the structure of a laser processing apparatus made from laser oscillator apparatuses 401a and 401b, a shutter 402, high conversion mirrors 403 to 406, cylindrical lenses 407 and 408, a slit 409, a holding platform 411, driving means 412 and 413 for positioning the holding platform 411 in the x-direction and the y-direction, a controlling means 414 for controlling the driving means, an information processing means 415 for sending signals to the laser oscillator apparatuses 401a and 401b, and the controlling means 414 based on a program stored in advance, and the like.

The laser oscillator apparatus applies a rectangular beam solid state laser oscillator apparatus, and in particular, preferably applies a slab laser oscillator apparatus. Alternatively, a solid state laser oscillator apparatus that uses a crystal such as YAG, YVO$_4$, YLF, YAlO$_3$, or the like doped with Nd, Tm, and Ho combined with a slab structure amplifier may also be used. Crystals such as Nd:YAG, Nd:GGG (gadolinium, gallium, garnet), Nd:GsGG (gadolinium, scandium, gallium, garnet) and the like can be used as the slab material. In addition, a gas laser oscillator apparatus, or a solid state laser oscillator apparatus, capable of emitting a continuous wave can also be applied. Laser oscillator apparatuses using crystals such as YAG, YVO$_4$, YLF, YAlO$_3$, or the like doped with Cr, Nd, Er, Ho, Ce, Co, Ti, or Tm are applied as continuous wave solid state laser oscillator apparatuses. Although differing by the dopant material used, the fundamental wave is emitted at a wavelength from 1 µm to 2 µm. A diode excited solid state laser oscillator apparatus may also be connected in cascade in order to obtain high output equal to or greater than 5 W.

Circular shape or rectangular shape laser light output from these types of laser oscillator apparatuses is concentrated into a linear shape in the cross sectional shape of an irradiation surface by the cylindrical lenses 407 and 408. Further, this becomes a structure in which a high conversion mirror is suitably regulated, and the laser light is made incident at an incline of 10 to 80° in order to prevent interference by the irradiation surface. A high transmissivity is obtained if the cylindrical lenses 407 and 408 are manufactured from synthetic quartz, and a coating implemented to the surfaces of the lenses is applied in order to achieve a transmissivity equal to or greater than 99% with respect to the wavelength of the laser light. The cross sectional shape of the irradiation surface is of course not limited to a linear shape, and arbitrary shapes such as a rectangular shape, an elliptical shape, and an oval shape may also be used. Whichever shape is employed, those having a ratio between their minor axis and their major axis contained within a range of 1 to 10, to 1 to 100, are indicated. Further, the wavelength converter element 410 is prepared in order to obtain a harmonic with respect to the fundamental wave.

Further, laser processing of a substrate 420 is possible by moving the holding platform 411 in two axial directions by using the driving means 412 and 413. For movement in one direction, it is possible to continuously move the holding platform 411 at a constant velocity from 1 to 200 cm/sec, preferably from 5 to 50 cm/sec, over a distance longer than the length of one side of the substrate 420. It becomes possible to perform non-continuous stepwise movement in the other direction over a distance on the same order as that of the longitudinal direction of the linear shape beam. Emission of the laser oscillator apparatuses 401a and 401b is operated in synchronous with operation of the holding platform 411 by the information processing means 415, in which a microprocessor is mounted.

It is possible to process the entire surface of the substrate by laser light irradiated from a fixed optical system by linear motion of the holding platform 411 in the x-direction shown in the figure. A position detecting means 416 detects that the substrate 420 is in a position for irradiating laser light, and transfers this signal to the information processing means 415. Emission operations of the laser oscillators 401a and 401b and their timing are synchronized by the information processing means 415. That is, the laser emission is stopped when the substrate 420 is not in a position for the irradiation of laser light, thus extending its lifetime.

Laser light emitted to the substrate 420 by a laser irradiation apparatus having this type of structure can process desired regions, or the entire surface, of the semiconductor film by relative motion in the x-direction and the y-direction shown in the figure.

As discussed above, a straight line stripe pattern having an uneven shape is formed by an insulating film, an amorphous semiconductor film is deposited on the stripe pattern, and the semiconductor flows into concave portions and hardens by irradiating laser light, thus taking the semiconductor through a melted state and causing crystallization to occur. Distortions and stress that occur along with crystallization can be concentrated in regions other than the concave portions, and it becomes possible to selectively form regions that do not have poor crystallinity such as crystal grain boundaries.

In other words, crystalline semiconductor films in which a plurality of crystal grains aggregate in a direction parallel to the direction in which the straight line shape strip pattern extends, can be made to remain in the concave portions having a plurality of crystal orientations without forming crystal grain boundaries. It becomes possible to increase high speed current driver performance by forming transistors so that their channel forming regions are prescribed by this type of crystalline semiconductor film, and it also becomes possible to increase element reliability.

Embodiment 2

In addition to the method of forming crystalline semiconductor films of the present invention disclosed in Embodiment 1, in which laser light is irradiated to an amorphous semiconductor film, thus causing crystallization, additional laser light may also be irradiated after crystallization due to solid state growth, thus causing melting and recrystallization.

Ni may be added as a metal element that has a catalytic action for promoting crystallization after forming the amorphous semiconductor film 106 in FIG. 2 in order, for example, to reduce the crystallization temperature of the amorphous semiconductor film (amorphous silicon film, for instance) and improve its orientation. There are no limitations placed on the method used for Ni addition, and spin coating, evaporation, sputtering, and the like may be applied. An aqueous solution of 5 ppm nickel acetate is applied when using spin coating, thus forming a metal element containing layer. The catalyst element is of course not limited to Ni, and other known materials may also be used.

The amorphous semiconductor film 106 is then crystallized by heat treatment at 580° C. for four hours. Laser light or strong light equivalent to the laser light is then irradiated to the crystallized semiconductor film, thus melting the crystalline semiconductor film and causing recrystallization. The crystalline semiconductor film 107 having a nearly level surface similar to that of FIG. 3 can thus be obtained. A region is also formed in the crystalline semiconductor film 107 in which growth ends and the crystal grain boundaries 110 are formed.

The advantage of using a crystallized semiconductor film as an object to be irradiated by laser light is in the degree of variability in the optical absorption coefficient of the semiconductor film. The optical absorption coefficient has almost no change when a crystallized semiconductor film is irradiated by laser light and melted. The margin placed on the laser light irradiation conditions can therefore be increased.

The metal element remains in the crystalline semiconductor film thus formed, and can be removed by using a gettering process. US No. 2002/0134981 may be referred to regarding details of this technique. Further, heat treatment performed in this gettering process also has an effect for relieving crystalline semiconductor film distortions.

The crystalline semiconductor film in concave portions is then extracted similarly to Embodiment 1. The extracted crystalline semiconductor film is one having a plurality of crystal orientations in which crystal grain boundaries are not formed. The gate insulating film and gate electrodes are then formed so that channel forming regions are positioned using island shape semiconductor regions, in particular the crystalline semiconductor film in the concave portions. Transistors can thus be completed through each of these stages.

Embodiment 3

An embodiment of manufacturing a transistor by forming a crystalline silicon film on a base insulating film having a concave portion, and disposing a channel forming region in a filling region that fills a convex portion, is explained with reference to figures in Embodiment 3. Note that, in each of the figures relating to Embodiment 3, the "A" figure shows an upper surface diagram, while the "B" and subsequent figures show longitudinal cross sectional diagrams of each portion corresponding to the "A" figure.

A first insulating film 302 is formed on a glass substrate 301 in FIGS. 7A to 7D by using 30 to 300 nm of silicon nitride, silicon oxynitride in which the amount of nitrogen contained is larger than the amount of oxygen, aluminum nitride, or aluminum oxynitride. A straight line shape stripe pattern having an uneven shape is then formed on the first insulating film 302 by using a second insulating film 303 made from a silicon oxide film or a silicon oxynitride film. The silicon oxide film is deposited to a thickness of 10 to 3000 nm, preferably form 100 to 2000 nm, by using plasma CVD with a mixture of TEOS and $O_2$, and by discharging at a high frequency (13.56 MHz) electric power density of 0.6 W/cm$^2$ with a reaction pressure of 40 Pa and a substrate temperature of 400° C. Concave portions 304 are then formed by etching. The width of the concave portions is from 0.1 to 2 μm, preferably from 0.1 to 1 μm, particularly in locations at which channel forming regions are disposed.

The second insulating film 303 is then removed by etching in regions intersecting with the island shape semiconductor films that structure transistors. Further, the second insulating film pattern may also be built in at the stage explained by FIGS. 7A to 7D.

A third insulating film 305 made from an oxide film or a silicon oxynitride film, and an amorphous semiconductor film 306 are formed next in succession by using the same plasma CVD apparatus, without exposure to the atmosphere, on the first insulating film 302 and the second insulating film 303, as shown by FIGS. 9A to 9E. The amorphous semiconductor film 306 is formed by a semiconductor film containing silicon as its main constituent, by using plasma CVD with $SiH_4$ as a source gas. A non-level surface shape covering bottom surfaces and side surfaces of the concave portions 304 is formed at this stage, as shown in the figures.

Crystallization is performed by irradiating continuous wave laser light. FIGS. 10A to 10E show states after crystallization. The crystallization conditions are as follows: a continuous wave mode $YVO_4$ laser oscillator is used; a second harmonic (wavelength 532 nm) output of 5 to 10 W is condensed by an optical system into linear shape laser light with a longitudinal to transverse ratio equal to or greater than 10 to obtain a uniform energy density distribution in the longitudinal direction; and the laser light is scanned at a velocity of 10 to 200 cm/sec, thus causing crystallization. The term uniform energy density distribution does not imply excluding energy density distributions that are not completely uniform, but denotes a permissible range for the energy density distribution of ±10%. This type of laser light irradiation can apply the laser processing apparatus structure as shown by FIG. 6.

The relationship between the scanning direction of laser light 360 condensed into a linear shape, and convex portion disposal is shown in FIGS. 17A and 17B. It is preferable that the intensity distribution of the laser light 360 condensed into a linear shape have a uniform region in the longitudinal direction. This is done so that the temperature of the heated substrate makes the temperature of the irradiated regions constant. If there is a temperature distribution in the longitudinal direction (direction intersecting with the scanning direction) of the laser light condensed into a linear shape, then the crystal growth direction cannot be limited to the scanning direction of the laser light. The crystal growth direction and the channel longitudinal directions of all of the transistors can be aligned by arranging the straight line shape stripe pattern with the scanning direction of the laser light 360 condensed into a linear shape, as shown in the figures. Dispersions in the characteristics between transistor elements can thus be reduced. Further, a portion, or all portions, can be shared by the pattern extending in a straight line shape, and therefore the margin on the laser light irradiation conditions can be increased. Dispersions in the silicon film due to ablation can therefore be stopped.

Further, crystallization by laser light condensed into a linear shape may be completed by only one scan (that is, in one direction). Forward and back scanning may also be performed in order to increase crystallinity. In addition, oxide removal by hydrofluoric acid or the like, and silicon film surface processing by an alkaline solution, such as ammonia peroxide processing, may be performed after the crystallization by the laser light, thus selectively removing poor quality portions having high etching speeds. A similar crystallization process may then be performed again. Crystallinity can thus be increased.

The amorphous semiconductor film can be instantaneously melted by irradiating laser light under these conditions. In practice, crystallization proceeds while moving a melted band. Surface tension acts on melted silicon, which aggregates in the concave portions and solidifies. A crystalline semiconductor film 307 having a level surface is thus formed in a state filling the concave portions 304 as shown in FIGS. 10A to 10E.

Etching processing is performed next as shown in FIGS. 11A to 11E so that the crystalline semiconductor film 307 at minimum remains in the concave portions 304. The crystalline semiconductor film on the third insulating film 305 is removed by this etching process, and the crystalline semiconductor film 307 made from a crystalline semiconductor film aligned with the shape of the concave portion is obtained. The crystalline semiconductor film can be etched selectively with respect to the base oxide film by using fluorine gas and oxygen as etching gasses. For example, a gas mixture of $CF_4$ and $O_2$ may be applied as the etching gas.

In addition, island shaped semiconductor films 308 to 310 shown in FIGS. 12A to 12E are formed from the crystalline semiconductor film 307 shown in FIGS. 11A to 11E. The island shape semiconductor film 308 has a plurality of crystal orientations, without crystal grain boundaries being formed, as shown by Embodiment 1. Note that FIGS. 12A to 12E do not show limitations of the shape of the island shape semiconductor films 308 to 310, and as stated by Embodiment 1, there are no particular limitations within a region following a predetermined design rule. For example, the shape of an island shape semiconductor film of FIGS. 8A to 8E has an embodiment in which a plurality of strip shape crystalline semiconductor films are connected with a pair of rectangular shape crystalline semiconductor films. As discussed later, this becomes an embodiment in which transistor channel forming regions are disposed in the plurality of strip shape crystalline semiconductor films.

Figure 13A:
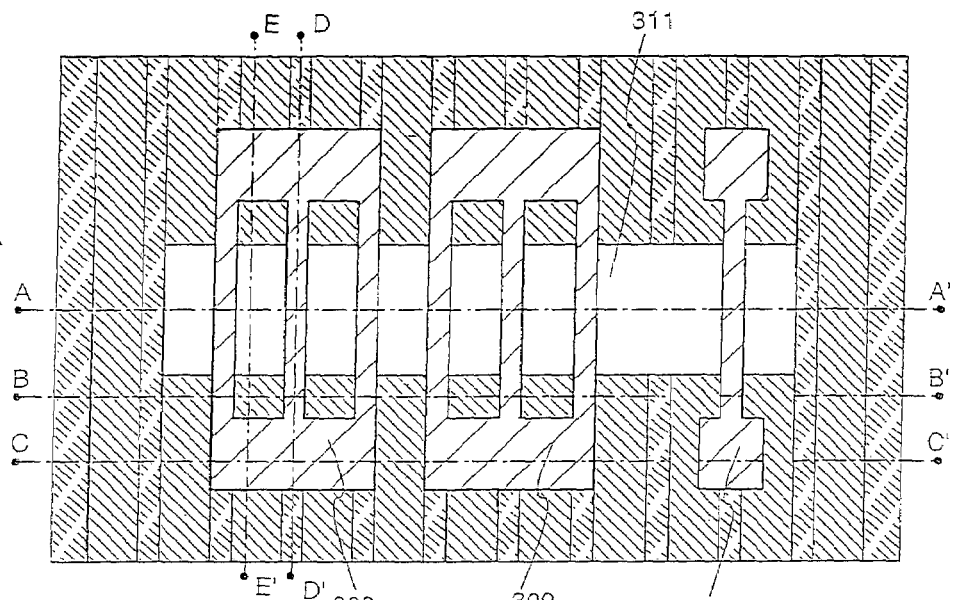
FIGS. 13A to 13F are an upper surface diagram and longitudinal cross sectional diagrams, respectively, for explaining the process of manufacturing a transistor manufactured in accordance with the present invention.
Figure 13B:
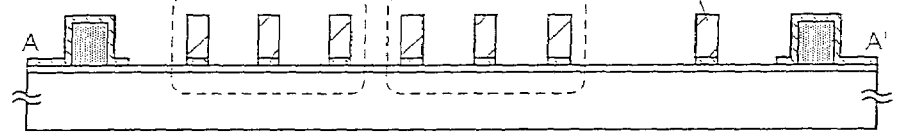
Figure 13C:
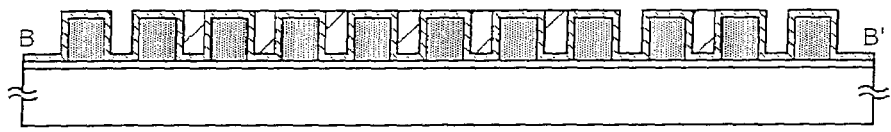
Figure 13D:
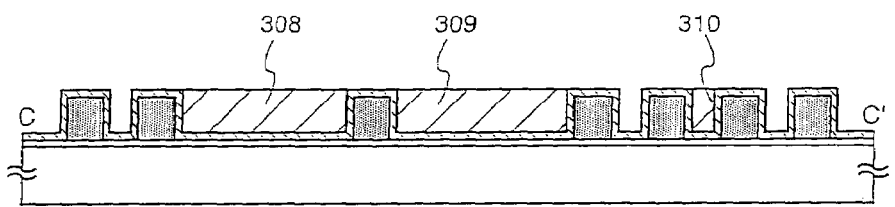
Figure 13E:
Figure 13F:
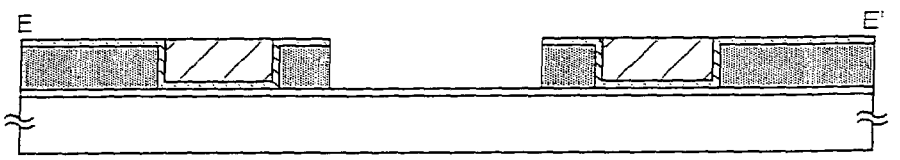
Figure 14A:
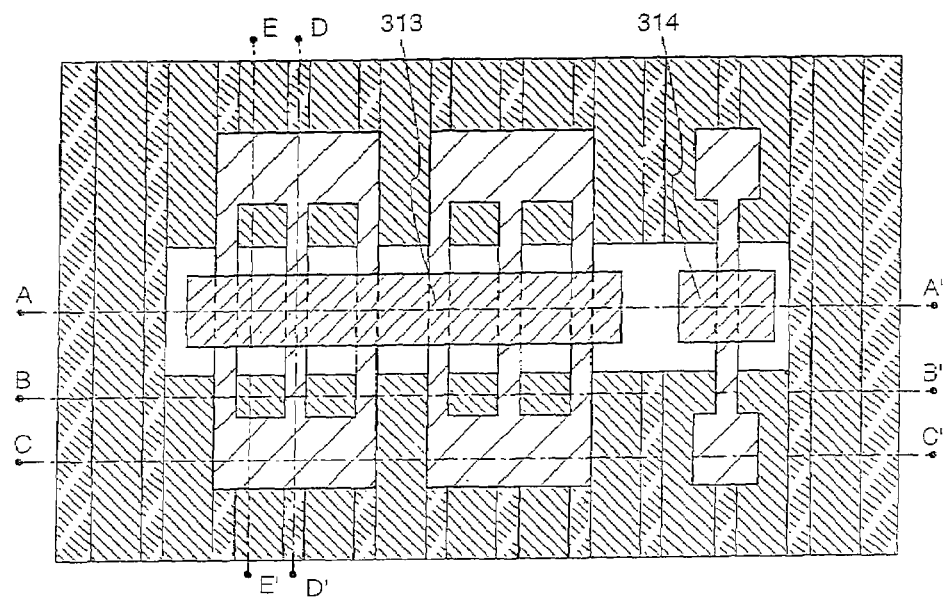
FIGS. 14A to 14F are an upper surface diagram and longitudinal cross sectional diagrams, respectively, for explaining the process of manufacturing a transistor manufactured in accordance with the present invention.
Figure 14B:
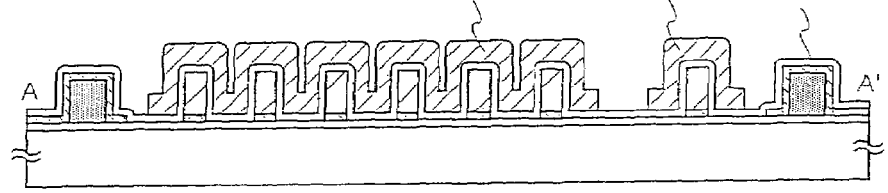
Figure 14C:
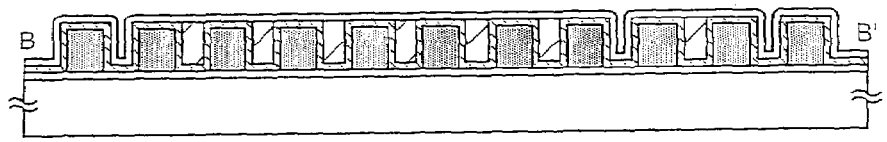
Figure 14D:
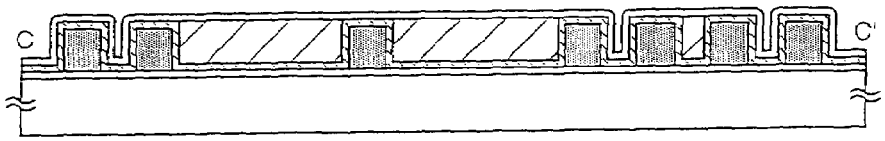
Figure 14E:
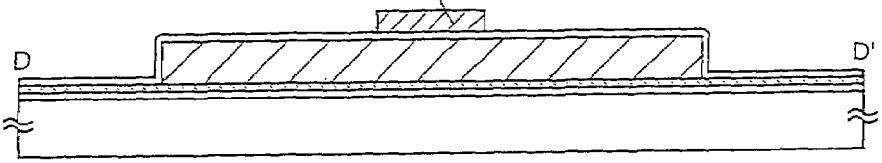
Figure 14F:
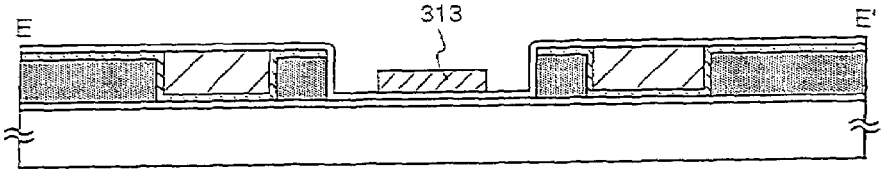
Figure 15A:
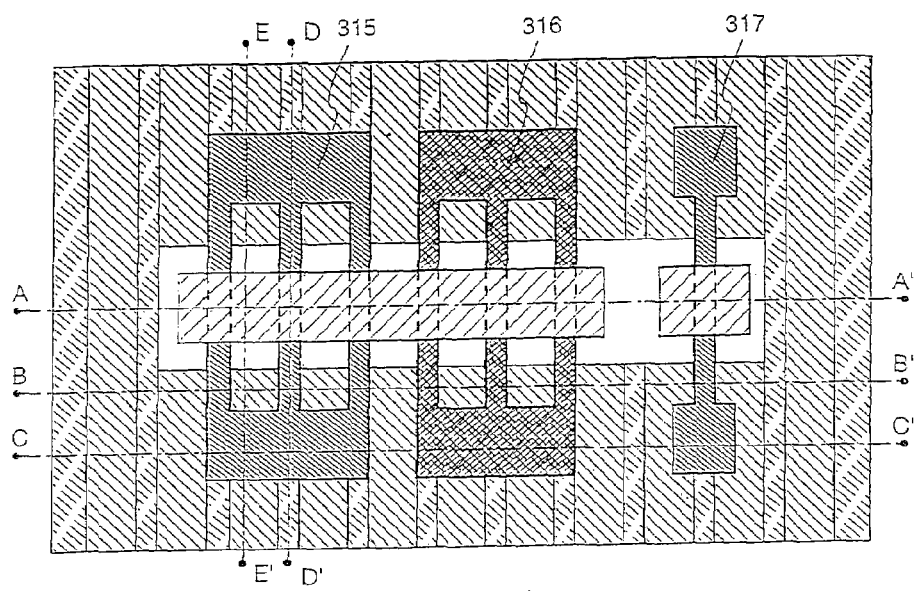
FIGS. 15A to 15F are an upper surface diagram and longitudinal cross sectional diagrams, respectively, for explaining the process of manufacturing a transistor manufactured in accordance with the present invention.
Figure 15B:
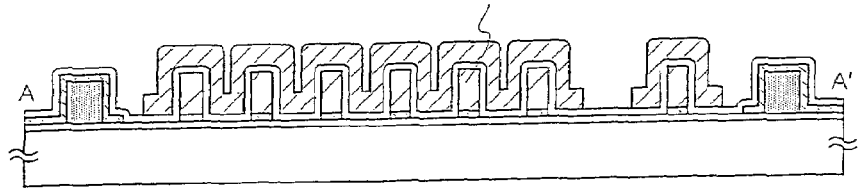
Figure 15C:
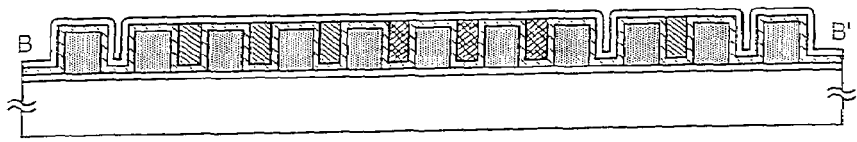
Figure 15D:
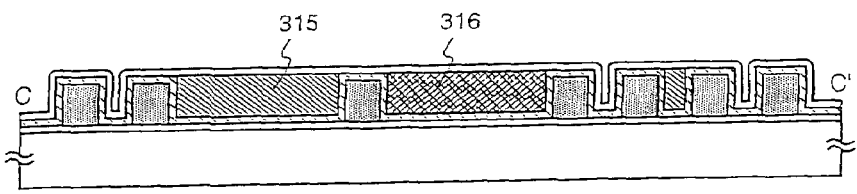
Figure 15E:
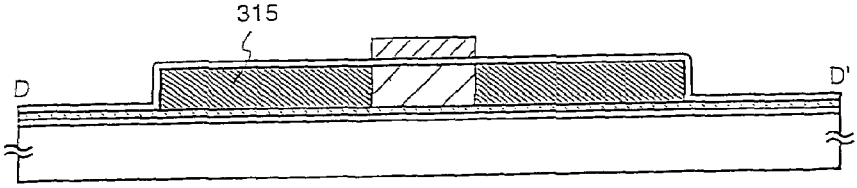
Figure 15F:
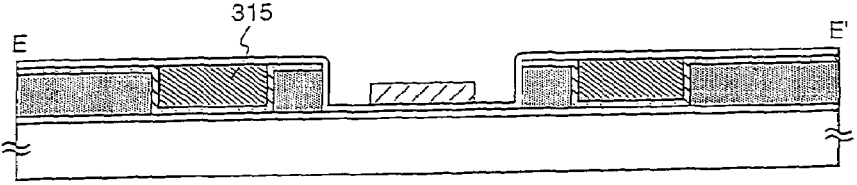
Figures 16A, 16B, 16C, 16D, 16E, 16F:
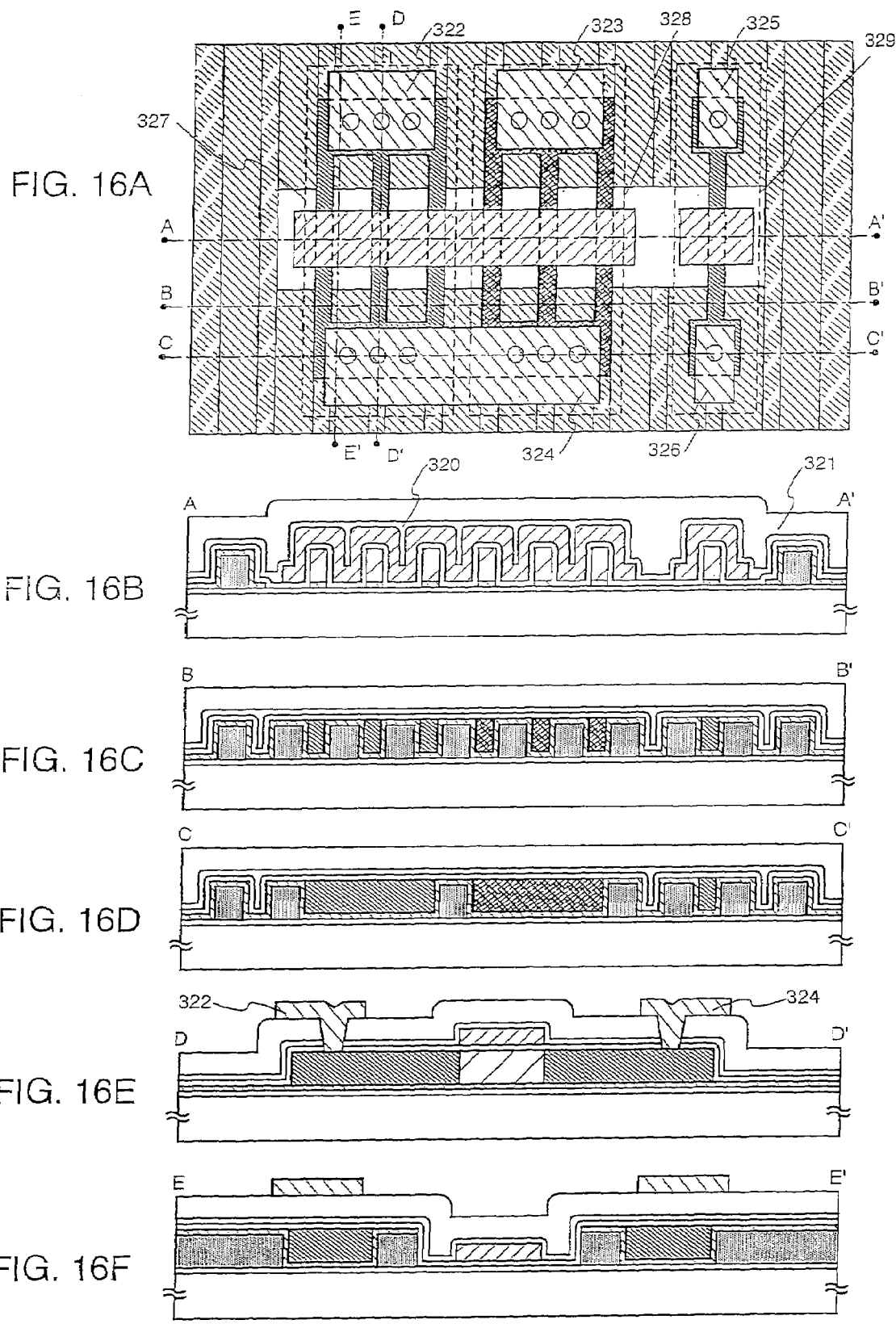
FIGS. 16A to 16F are an upper surface diagram and longitudinal cross sectional diagrams, respectively, for explaining the process of manufacturing a transistor manufactured in accordance with the present invention.

The second insulating film in the periphery of where the channel forming regions of the island shape semiconductor films 308 to 310 are disposed are removed next by etching thus forming a concave portion 311 as shown by FIGS. 13A to 13F. This etching process can be performed by chemical etching using buffered hydrofluoric acid, by dry etching using $CHF_3$, and the like. Side surface portions and upper surface portions of the island shape semiconductor films 308 to 310 disposed in the region at which the concave portion 311 is formed are thus exposed as shown in FIG. 13B. The third insulating film 305 remains in the bottom surface, and contacts the first insulating film 302. The second insulating film remains in other portions, and contacts the island shape semiconductor films 308 to 310.

Etching may be performed so that the etching depth in this process is up through the first insulating film, as shown by FIG. 18A, thus forming the concave portion 311. All of the side surfaces portions of the island shape semiconductor films 308 and 309 can be made into channel forming regions, as discussed later, by using this type of embodiment for cases in which gates are formed in these portions. Further, etching may also be stopped within the second insulating film, as shown by FIG. 18B. Whichever etching depth is used, the depth of the channel forming regions of the island shape semiconductor films 308 and 309 can be regulated by regulating the etching depth. That is, crystalline regions can be selectively formed.

A fourth insulating film 312 used as a gate insulating film covering upper surfaces and side surfaces of the island shape semiconductor film 308, and conductive films 313 and 314 used as gate electrodes are formed in FIGS. 14A to 14F. The fourth insulating film 312 is formed by using a 30 to 200 nm silicon oxide film or silicon oxynitride film. Further, the conductive films 313 to 314 are formed by using tungsten, an alloy containing tungsten, aluminum, an aluminum alloy, or the like.

A stage of forming one conductivity impurity regions 315 to 317 in the island shape semiconductor films 308 to 310 is shown in FIGS. 15A to 15F. The n-type impurity regions 315 and 317, and the p-type impurity region 316 are formed here for convenience. These impurity regions may be formed in a self-aligning manner with the conductive films 313 and 314, which are used as gate electrodes, as masks. The impurity regions may also be formed by masking using photoresist or the like. The impurity regions 315 to 317 form source and drain regions, and when necessary, can also be applied as low concentration drain regions.

The impurity regions 315 to 317 apply ion injection, ion doping, or the like in which impurity ions are accelerated by an electric field, and then injected to the semiconductor film. In this case, whether or not mass separation of the injected ion types is present does not become an essential problem for application to the present invention. However, it is preferable that oblique doping, in which injection is performed while the substrate is disposed at an incline with respect to the ion injection direction and is rotated, be performed in order to inject impurity ions with good efficiency into the side surface portions of the island shape semiconductor films 308 to 310.

A region overlapping with the conductive layers 313 and 314, which form gate electrodes, in the island shape semiconductor film becomes a channel forming region 318. Details of portions of the channel forming region 318 are shown in FIG. 19. The conductive layer 313, which functions as a gate electrode, is disposed in side surface portions and upper surface portions of the island shape semiconductor film in the channel forming region 318, through the fourth insulating film 312 that functions as a gate insulating film. A channel 319 formed by applying an electric potential is therefore formed across the side surface portions and the upper surface portions of the semiconductor film. Depletion regions can thus easily be increased, and the current driver performance of the transistor can be increased.

A fifth insulating film 320 is formed next with a thickness on the order of 50 to 100 nm by using a silicon nitride film or a silicon oxynitride film containing hydrogen, as shown in FIGS. 16A to 16F. The hydrogen contained in the silicon nitride film or the silicon oxynitride film can then be released by performing heat treatment at a temperature of 400 to 450° C. in this state, thus performing hydrogenation of the island shape semiconductor films. A sixth insulating film 321 is formed from a silicon oxide film or the like, and wirings 322 to 326, which contact the impurity 313 that forms a source region and a drain region, are formed.

An n-channel transistor and a p-channel transistor can thus be formed. FIGS. 16A to 16F show a multi-channel transistor formed by disposing a plurality of channel forming regions in parallel, and connecting them with a pair of impurity regions. Further, an example of structuring an inverter circuit, which is a fundamental circuit having a CMOS structure, by an n-channel multi-channel transistor 327 and a p-channel multi-channel transistor 328 is shown. There are no limitations on the number of channel forming regions disposed in parallel in this structure, and a plurality of channel forming regions may be formed when necessary. For example, a single channel such as an n-channel transistor 329 may also be used.

Embodiment 4

Figure 20A:
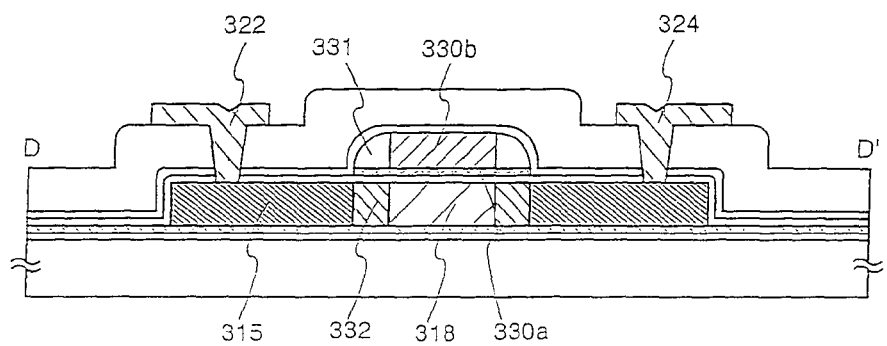
FIGS. 20A to 20C are longitudinal cross sectional diagrams showing examples of gate structures capable of being applied to a transistor manufactured in accordance with the present invention.
Figure 20B:
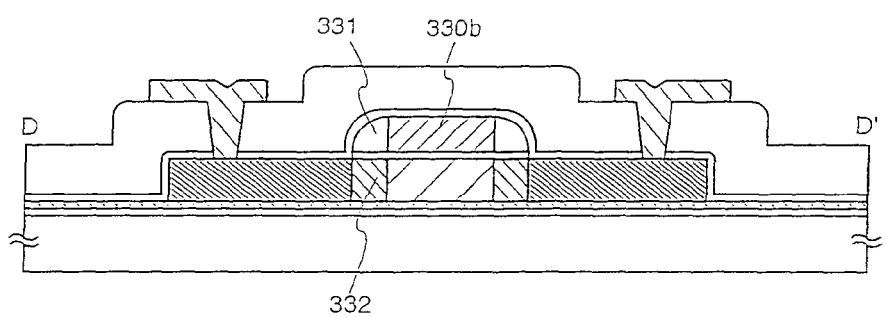
Figure 20C:
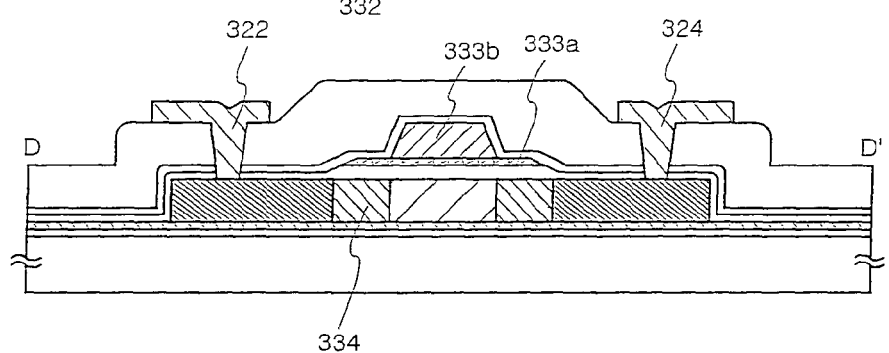

The transistors are shown by single drain structures in Embodiment 3, but a low concentration drain (LDD) may also be formed. FIGS. 20A to 20C show examples of n-channel multi-channel transistors possessing an LDD structure.

A transistor structure shown by FIG. 20A is an example in which a gate electrode is formed by using a nitride metal 330a such as titanium nitride or tantalum nitride, and a high melting point metal 330b such as tungsten or a tungsten alloy. Spacers 331 may also be formed in side surfaces of the gate electrode 330b. The spacers 331 may be formed by using an insulator such as silicon oxide, and may also be formed by using n-type polycrystalline silicon in order to provide conductivity. The spacers 331 may be formed by using anisotropic dry etching. By forming an LDD region 332 before forming the spacers, the gate electrode 330b can be formed in a self-aligning manner. A gate-overlapped LDD structure can be made by the LDD region effectively overlapping with the gate electrode for cases in which the spacers are formed by using a conductive material.

On the other hand, FIG. 20B is a structure in which the gate electrode 330a is not formed, resulting in an LDD structure.

In FIG. 20C an n-type impurity region 334, which forms an LDD region, is formed contacting the n-type impurity region 315. A gate electrode 333 has a two layer structure, and the n-type impurity region 334, which forms the n-type impurity region 322 and an LDD region, can be formed in a self-aligning manner. Details of this type of gate electrode, impurity region, and a method for manufacturing the gate electrode and the impurity region can be found in US 2001/0035526 and US 2002/0098628.

Whichever is employed, structures in which an LDD region is formed in a self-aligning manner by this type of gate structure are particularly effective for cases in which the design rule is refined. Although a single polarity transistor structure is shown here, a CMOS structure can also be formed similarly to that of Embodiment 3.

Note that structures other than the gate electrode and the LDD region are the same as those of Embodiment 3, and therefore a detailed explanation is omitted in Embodiment 4.

Embodiment 5

The present invention can be applied to various types of semiconductor devices. A display panel manufactured based on Embodiments 1 to 4 is explained.

Figure 21:
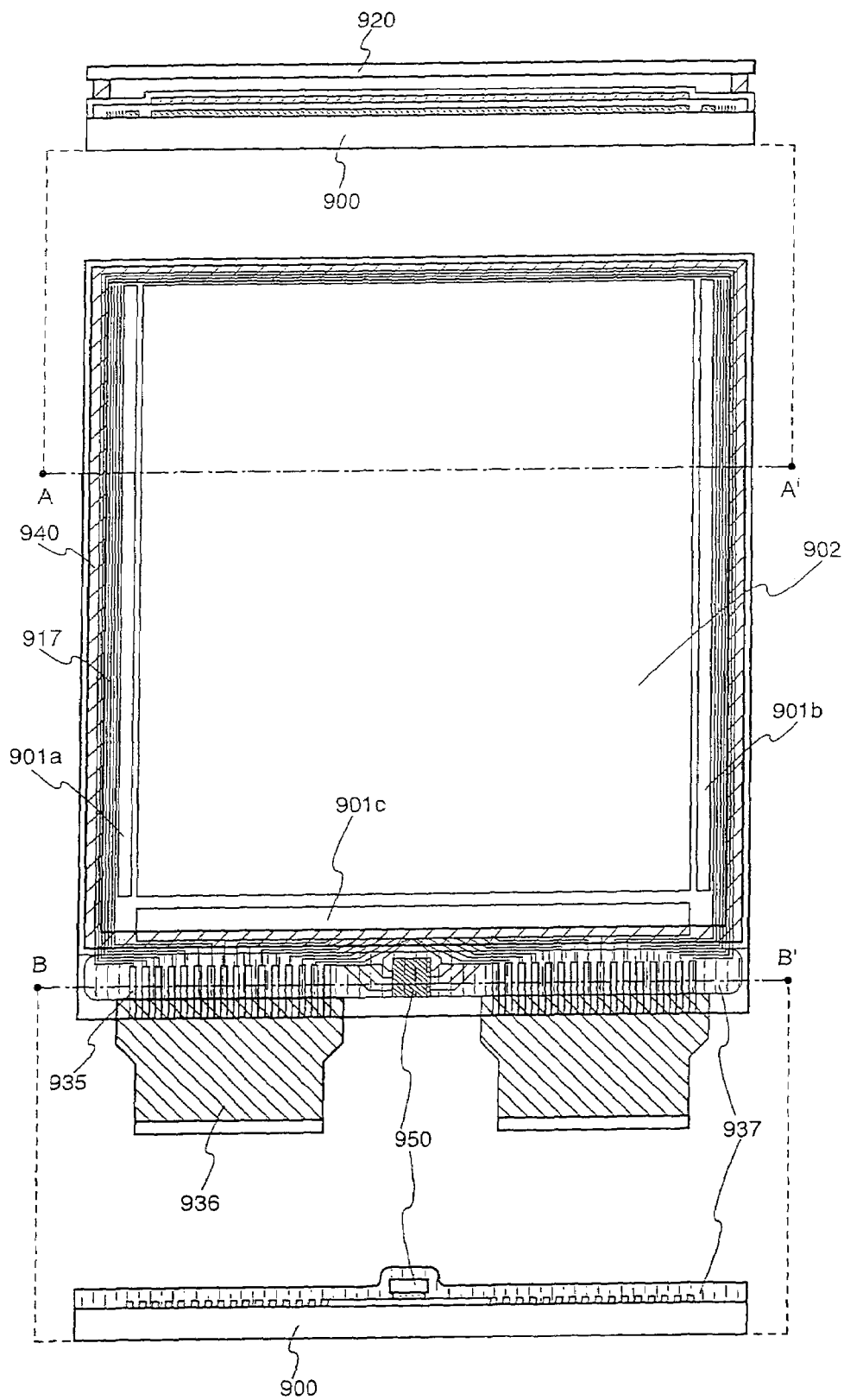
FIG. 21 is an example of an external view of a semiconductor device manufactured by using the present invention.

A pixel portion 902, gate signal side driver circuits 901a and 901b, a data signal side driver circuit 901c, an input-output terminal portion 908, and wirings or a wiring group 917 are prepared on a substrate 900 in FIG. 21. A seal pattern 940 may overlap with a portion of the wirings or wiring group 917 that connects the gate signal driver circuits 901a and 901b, the data signal driver circuit 901c, and a driver circuit portion with input terminals. The surface area of a frame region (periphery region of the pixel portion) of the display panel can thus be reduced. An FPC 936 is fixed to an external input terminal portion. Reference numeral 937 denotes a sealing resin.

In addition, a chip 950 on which a logic circuit, high frequency circuit, microprocessor, memory, media processor/DSP (digital signal processor) or the like is formed using transistors of the present invention may also be mounted. These functional circuits are be formed by using design rules that differ from those of the pixel portion 902, the gate signal driver circuits 901a and 901b, and the data signal driver circuit 901c. Specifically, a design rule of 1 μm or less is applied. Structures of FIG. 20A, FIG. 20B, and the like may be applied as the transistor gate structure. Further, there are no limitations placed on the mounting method, and a COG method or the like may be applied.

The transistors shown by Embodiments 3 and 4 can be applied as switching elements of the pixel portion 902, and in addition, as active elements that structure the gate signal driver circuits 901a and 901b and the data signal driver circuit 901c.

Figure 25:
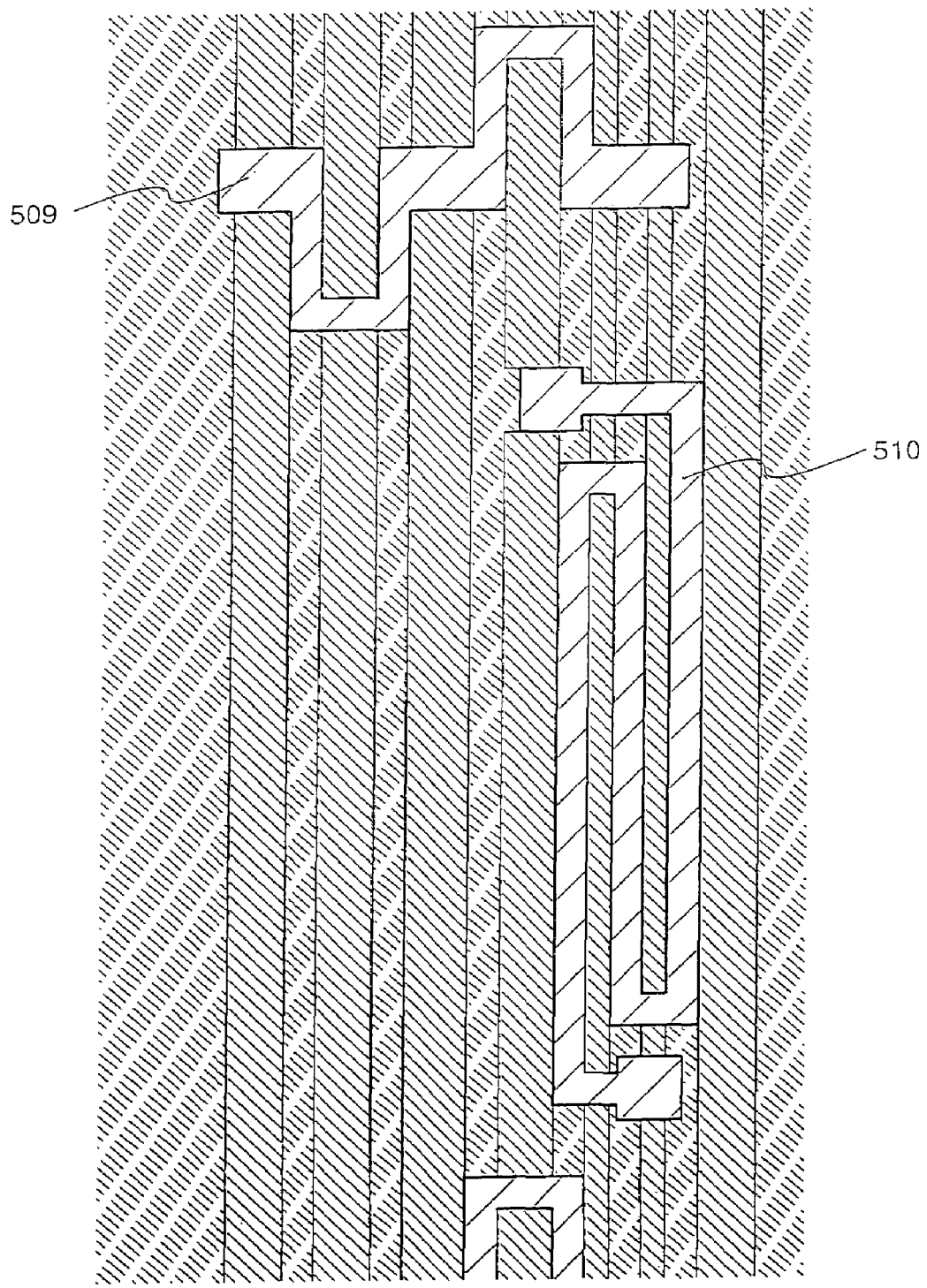
FIG. 25 is an upper surface diagram for explaining the process of manufacturing a pixel portion of the semiconductor device shown by FIG. 21.
Figure 26:
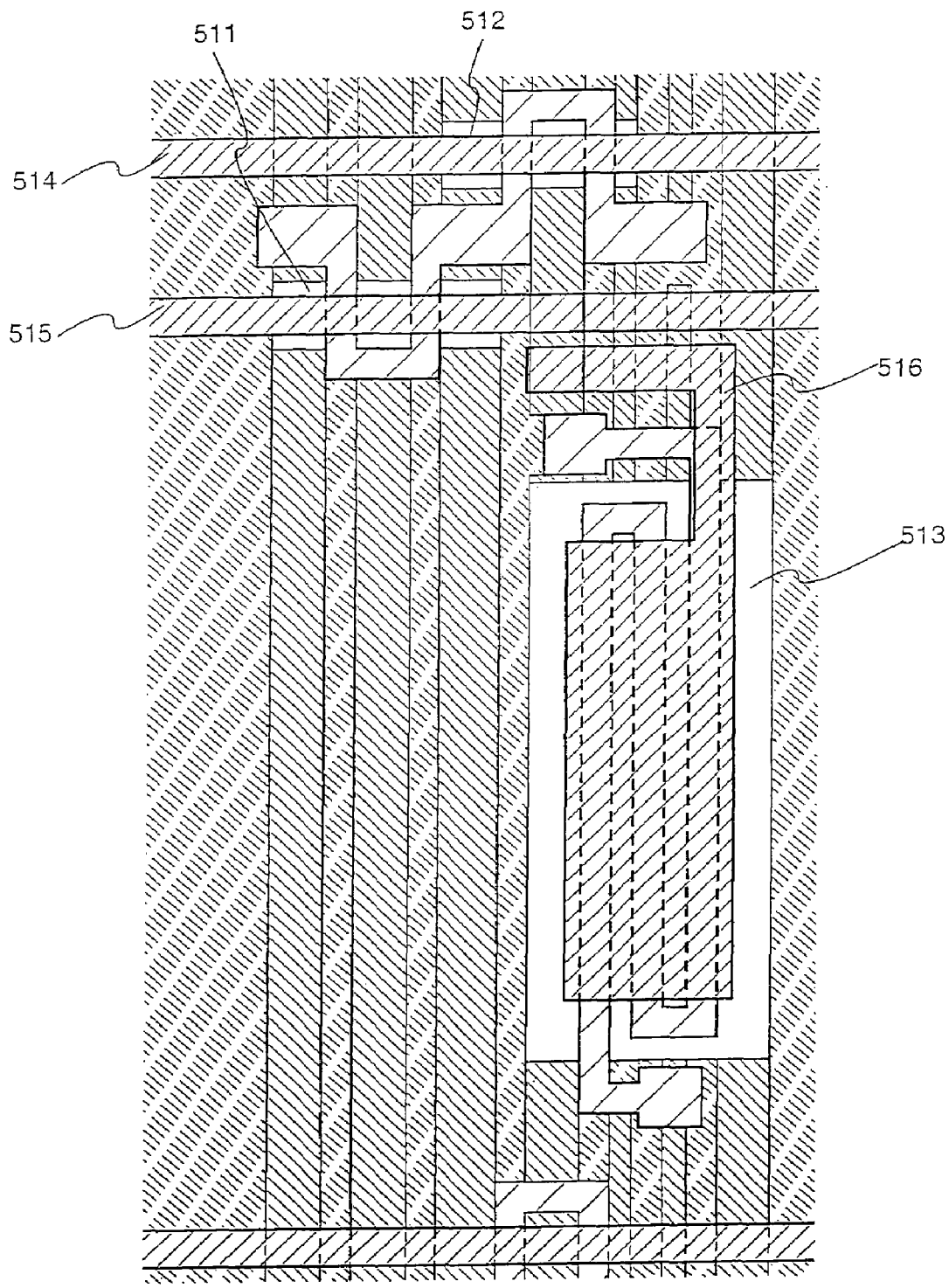
FIG. 26 is an upper surface diagram for explaining the process of manufacturing a pixel portion of the semiconductor device shown by FIG. 21.
Figure 27:
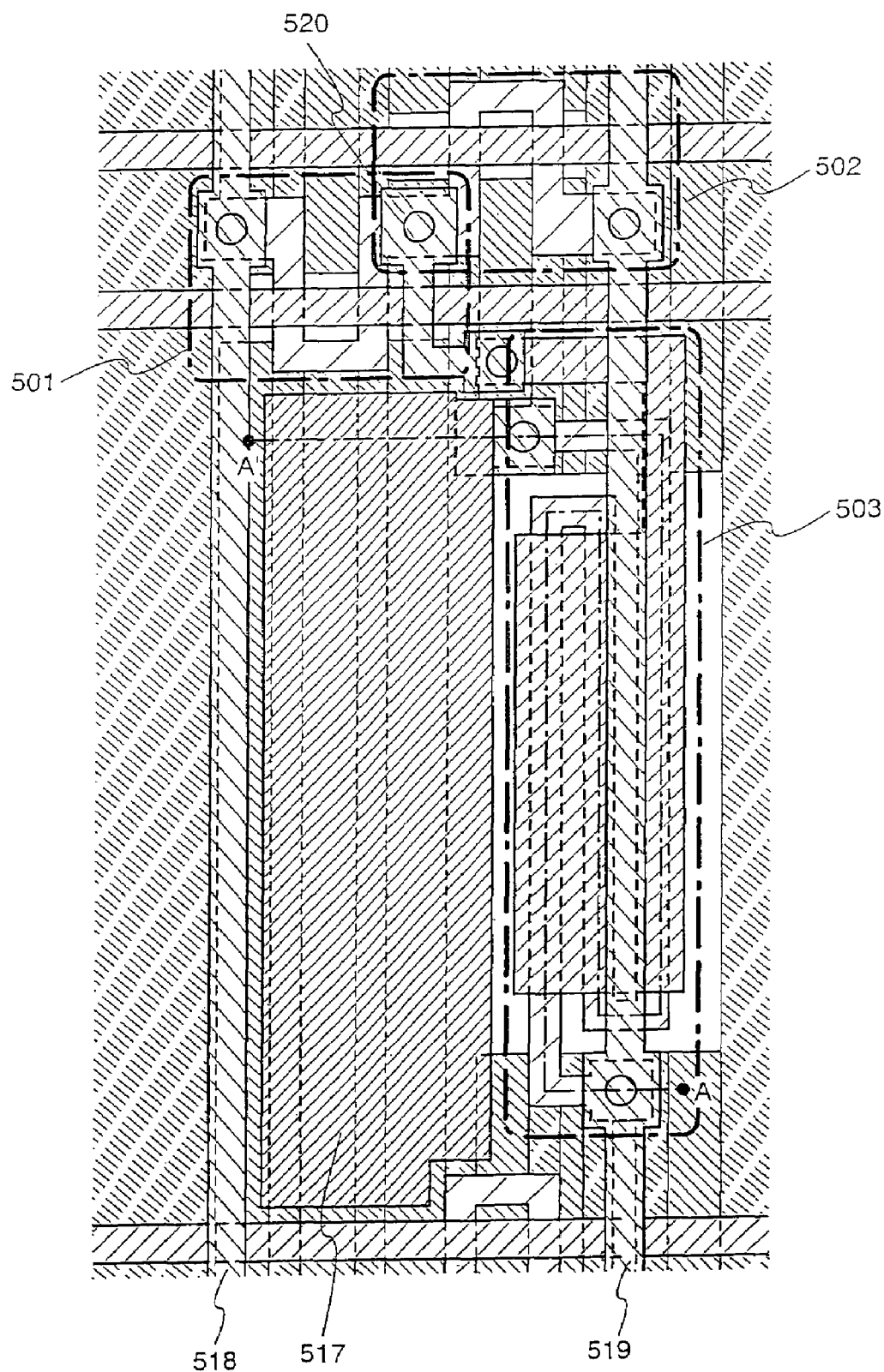
FIG. 27 is an upper surface diagram for explaining the structure of a pixel portion of the semiconductor device shown by FIG. 16.

FIG. 27 is an example showing the structure of one pixel of the pixel portion 902, and transistors 501 to 503 are prepared. These transistors are switching transistors, reset transistors, and driver transistors for controlling light emitting elements or liquid crystal elements prepared in the pixels. FIGS. 22 to 27 show manufacturing processes for these transistors. Note that process details are the same as those of Embodiment 3, and a detailed explanation is omitted here.

Figure 22:
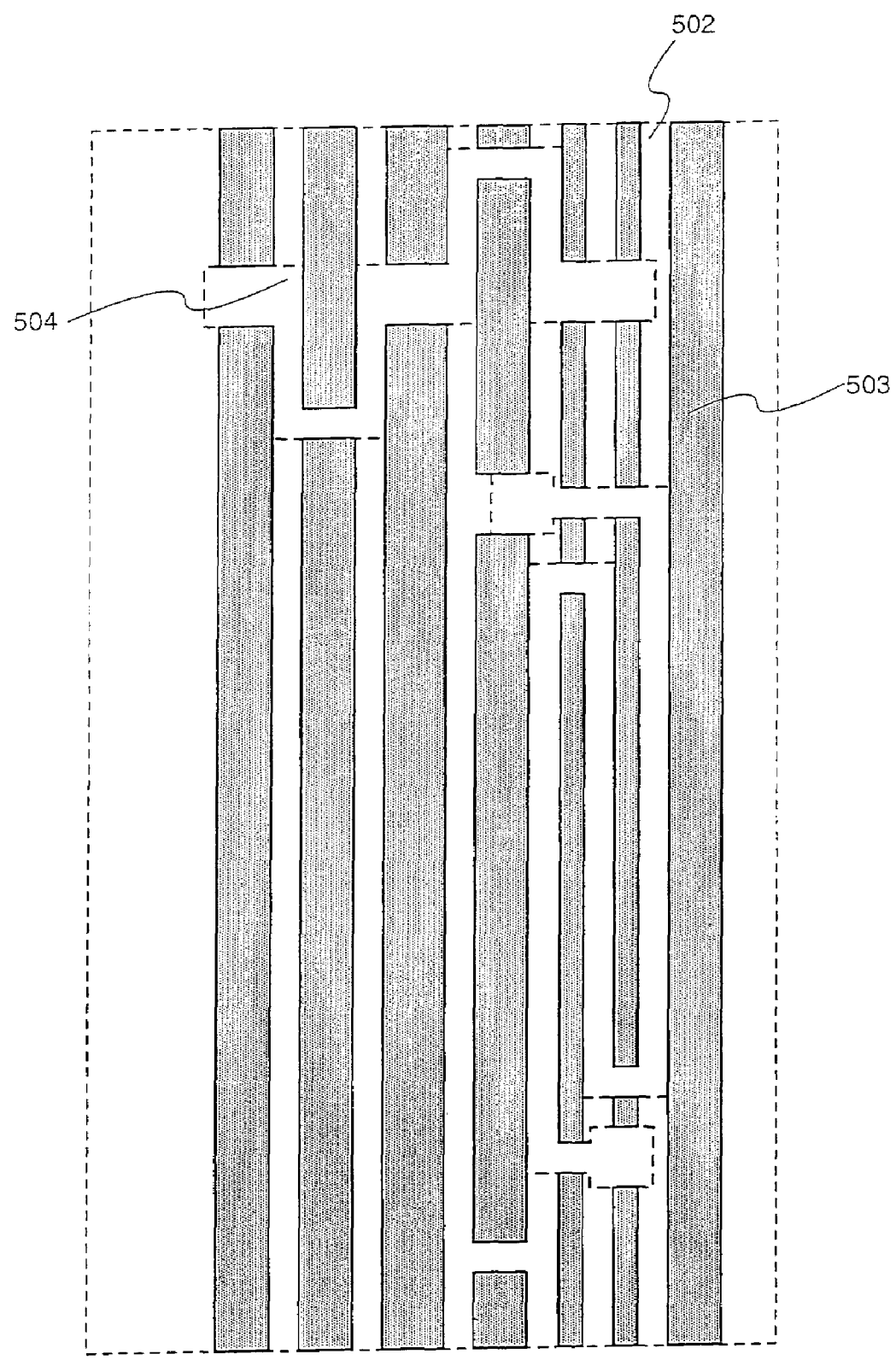
FIG. 22 is an upper surface diagram for explaining a process of manufacturing a pixel portion of the semiconductor device shown by FIG. 21.

FIG. 22 shows a state in which a first insulating film 502 and a second insulating film 503 that forms a straight line stripe pattern are formed. A concave portion 504 is formed by the second insulating film. A region surrounded by a dotted line in the figure denotes a region in which an island shape semiconductor film containing a channel forming region is formed.

Figure 23:
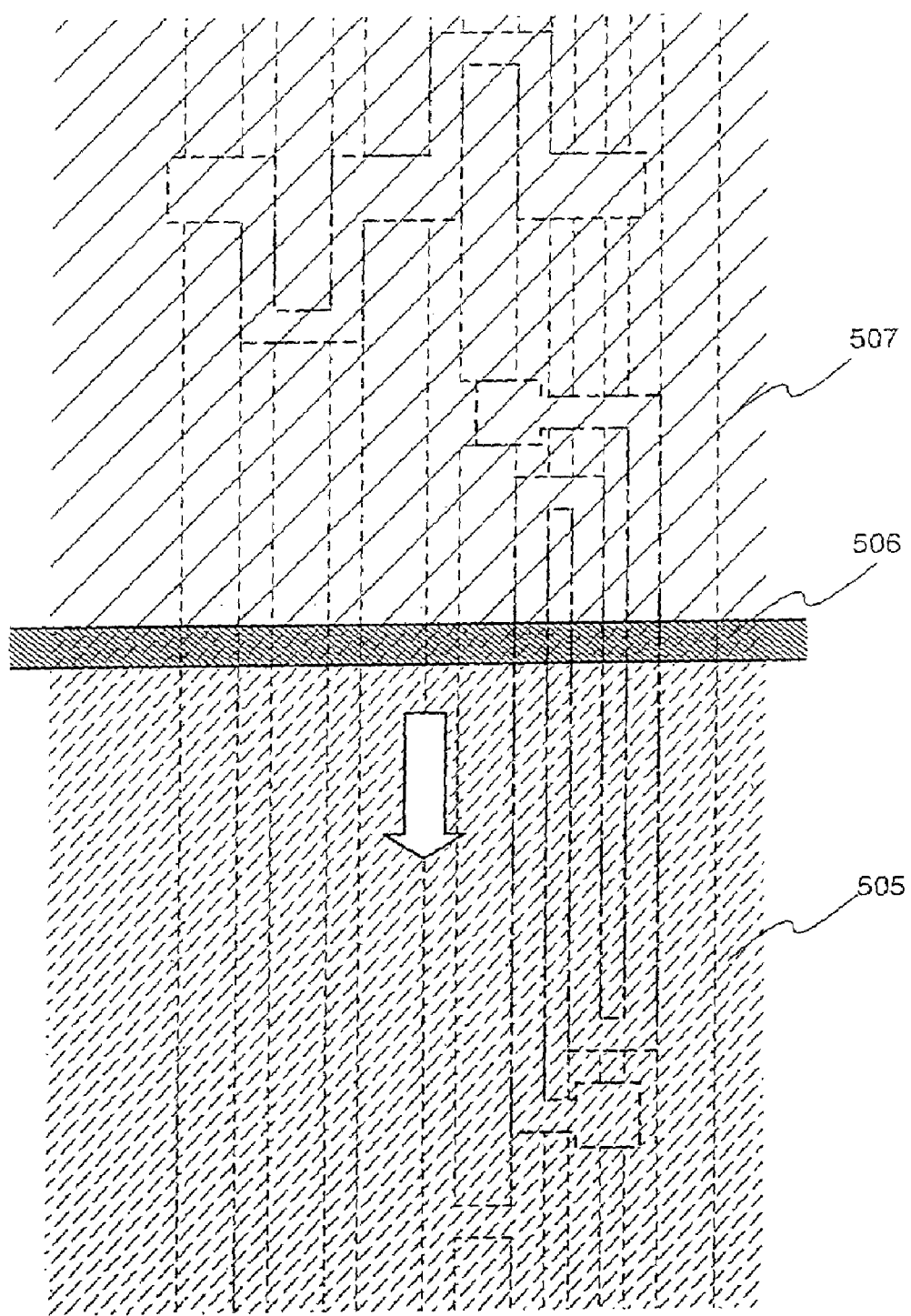
FIG. 23 is an upper surface diagram for explaining the process of manufacturing a pixel portion of the semiconductor device shown by FIG. 21.

FIG. 23 shows a stage at which an amorphous semiconductor film 505 is deposited on top of the first insulating film 502 and the second insulating film 503, and a crystalline semiconductor film 507 is formed by irradiating laser light 506, which is concentrated into a linear shape, to the amorphous semiconductor film.

Figure 24:
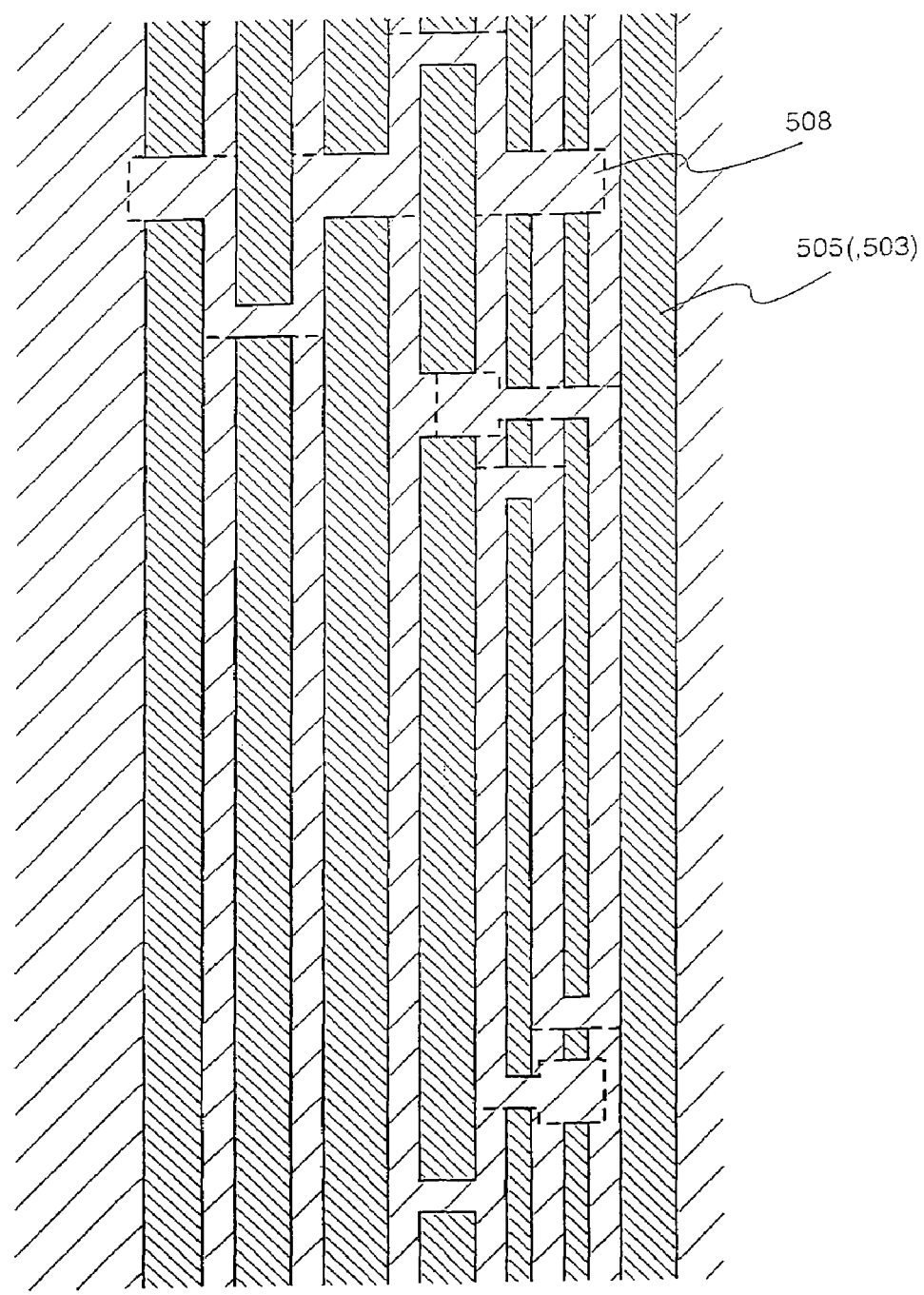
FIG. 24 is an upper surface diagram for explaining the process of manufacturing a pixel portion of the semiconductor device shown by FIG. 21.

FIG. 24 shows a state in which the crystalline semiconductor film formed on the second insulating film 503 is selectively removed by etching, thus forming a crystalline semiconductor film 508 having such a shape that fills the concave portion. In addition, FIG. 25 shows a state in which the crystalline semiconductor film 508 is etched, thus forming island shape semiconductor films 509 and 510.

The second insulating film is then etched as shown by FIG. 26, thus forming concave portions 511 to 513, and partially exposing side surface portions of the island shape semiconductor films 509 and 510. In addition, a gate insulating film (not shown in the figures) and gate electrodes (or gate wirings) 514 to 516 are formed. The concave portions 511 to 513 are formed in alignment with positions at which the island shape semiconductor films 509 and 510 intersect with the gate electrodes (or gate wirings) 514 to 516. A gate structure similar to that of Embodiment 3 can thus be obtained. Further, regarding the details of the gate structure, the structure disclosed in Embodiment 4 may also be employed.

An n-type or a p-type impurity region is formed next, and a pixel structure shown by FIG. 27 can be obtained by forming various types of wirings 518 to 520 and a pixel electrode 517, through an insulating film.

FIG. 28A shows a longitudinal cross sectional diagram corresponding to a line segment A-A' in FIG. 27. In addition, a liquid crystal display device or an organic light emitting device can be completed by using the pixel electrode 517 as shown in FIG. 28B.

FIG. 28B shows a state in which light, emitted from an organic light emitting element 33, is irradiated to the side opposite that of the substrate (upward emission). A cathode, which is one of the electrodes of the organic light emitting element 33 connected to the wiring 520, is formed by the pixel electrode 517. An organic compound layer 27 is formed by an electron injecting and transporting layer, a light emitting layer, and a hole injecting and transporting layer, in order from the cathode side. A thin, light transmitting metal layer 28 is formed between an upper layer side of the organic compound layer 27, and an anode 29. The anode 29 is formed by a resistance heating evaporation method using a light transmitting conductive film such as indium tin oxide (ITO), zinc oxide (ZnO), or indium zinc oxide (IZO). The metal layer 28 prevents damage to the organic compound layer 27 and degradation of its element characteristics caused by forming the anode 29. A protective film 24 and a passivation film 25 are formed next.

For cases in which the organic compound layer 21 is formed by using low molecular weight organic compounds, the layer may be a laminate of a hole injecting and transporting layer made from copper phthalocyanine (CuPc) and the aromatic amine materials MTDATA and α-NPD, and an electron injecting and light emitting layer made from tris-8-quinolinolate aluminum complex ($Alq_3$). It is possible to make $Alq_3$ emit light from a singlet excitation state (fluorescence).

It is preferable to utilize light emission from a triplet excitation state (phosphorescence) in order to increase brightness. In this case, as the organic compound layer 21, a structure can be used in which a light emitting layer made from carbazole CBP+Ir(ppy)$_3$ is formed on a hole injecting and transporting layer, which is made from the phthalocyanine material CuPc and the aromatic amine material α-NPD, and in addition, a hole blocking layer made from vasocuproin (BCP), and an electron injecting and transporting layer made from $Alq_3$ are laminated on top.

The aforementioned two structures are examples that use low molecular weight organic compounds, but an organic light emitting device in which high molecular weight organic compounds are combined with low molecular weight organic compounds can also be realized. For example, a hole injecting and transporting layer made from a polythiophene derivative (PEDOT), which is a high molecular weight organic compound, a hole injecting and transporting layer made from α-NPD, a light emitting layer made from CBP+Ir(ppy)$_3$, a hole blocking layer made from BCP, and an electron injecting and transporting layer made from $Alq_3$ may be laminated in the stated order from the anode side as the organic compound layer 21. The hole injecting characteristics are improved by changing the hole injecting layer to PEDOT, and the light emission efficiency can be increased.

Whichever structure is used, light emission from a triplet excitation state (phosphorescence) has a higher light emission efficiency than that of light emitted from a singlet excitation state (fluorescence), and it is possible to reduce the operating voltage (voltage needed to make the organic light emitting element emit light) in order to obtain the same brightness.

A display panel that uses an organic light emitting element of the present invention can thus be manufactured. An embodiment in which the emitted light is irradiated to the substrate side (downward emission) can also be made provided that the positions of the anode and the cathode are reversed. In addition, although not shown in the example here, a display panel that utilizes the electro-optical characteristics of liquid crystals can also be manufactured.

Embodiment 6

As explained in Embodiment 3 using FIG. 19, in a transistor of the present invention, channel forming regions can be formed in sidewall portions and upper edge portions of an island shape semiconductor film. In addition, it becomes possible to apply a body bias by forming a conductive layer in a lower layer side. A method of manufacturing the transistor follows the description of Embodiment 3, and differences are explained using FIGS. 29A to 29C.

A silicon nitride film is formed on a substrate in FIG. 29A as a first insulating film 802, and a tungsten film 803 is formed on the first insulating film 802 by using sputtering. In particular, it is possible to form a fine film if the silicon nitride film is formed by high frequency sputtering. A second insulating film 803 is formed of a silicon oxide film. Concave portions are formed in the silicon oxide film by etching, as shown in the figures, and the concave portions can be easily formed because the selectivity with respect to the base tungsten film is on the order of 30.

A silicon oxynitride film is formed on top as a third insulating film 805, and an amorphous semiconductor film 806 is formed in succession. Crystalline silicon films 807 are formed as shown in FIG. 29B by performing melting, crystallization, and in addition, etching surface portions. A gate insulating film 808 and a gate electrode 809 are formed next as shown in FIG. 29C. The gate insulating film 808 is formed on the tungsten film 803, and therefore short circuits with the gate electrode 809 do not occur.

Dispersions in transistor threshold values can be reduced in this type of embodiment if the tungsten film 803 is fixed at a ground electric potential. Further, the on current can be increased if the same electric potential as that of the gate electrode 809 is used in driving.

Further, aluminum nitride or aluminum oxide may also be formed on an upper layer of the tungsten film 803 in order to increase the heat emission effect as shown by FIG. 30. Another reason for forming aluminum nitride or aluminum oxide here is that selectivity can be maintained in the etching process. That is, silicon nitride is not suitable when removing the second insulating film, which is silicon oxide, to expose the base metal film by using a fluorine etching gas such as $CHF_3$. Aluminum nitride or aluminum oxide is suitable.

This type of transistor structure can be combined with any structure of Embodiments 3 through 5.

Embodiment 7

The present invention can be used in various devices. Examples thereof include portable information terminals (electronic schedulers, mobile computers, mobile telephones, and the like), video cameras, digital cameras, personal computers, television monitors, mobile telephones, projection display devices, and the like. FIG. 34 shows examples of the devices.

Figure 34A:
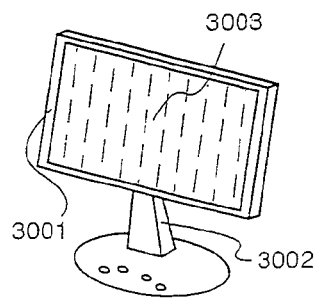
FIGS. 34A to 34G are diagrams showing examples of semiconductor devices.

FIG. 34A shows an example of application of the present invention to a television monitor, which is composed of a case 3001, a supporting base 3002, a display unit 3003, etc. A transistor manufactured in accordance with the present invention can be used in the display unit 3003 and, in addition, in various integrated circuits formed on a glass substrate, such as various logic circuits, high-frequency circuits, memories, microprocessors, media processors, and graphics LSIs to complete a television monitor in accordance with the present invention.

Figure 34B:
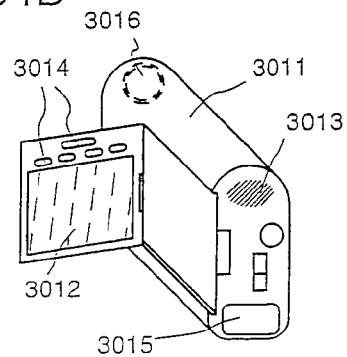

FIG. 34B shows an example of application of the present invention to a video camera, which is composed of a main body 3011, a display unit 3012, an audio input unit 3013, operation switches 3014, a battery 3015, an image receiving unit 3016, etc. A transistor manufactured in accordance with the present invention can be used in the display unit 3012 and, in addition, in various integrated circuits formed on a glass substrate, such as various logic circuits, high-frequency circuits, memories, microprocessors, media processors, and graphics LSIs to complete a video camera in accordance with the present invention.

Figure 34C:
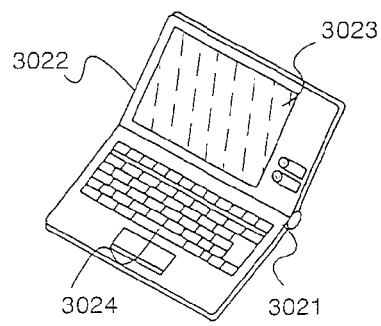

FIG. 34C shows an example of application of the present invention to a notebook personal computer, which is composed of a main body 3021, a case 3022, a display unit 3023, a keyboard 3024, etc. A transistor manufactured in accordance with the present invention can be used in the display unit 3023 and, in addition, in various integrated circuits formed on a glass substrate, such as various logic circuits, high-frequency circuits, memories, microprocessors, media processors, graphics LSIs, and encoder LSIs to complete a personal computer in accordance with the present invention.

Figure 34D:
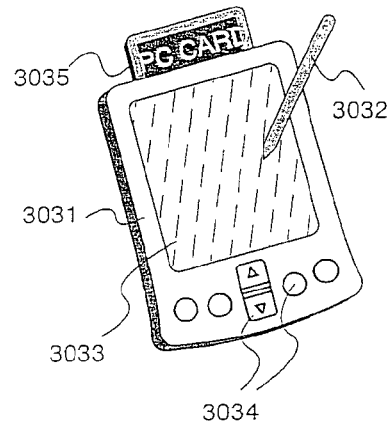

FIG. 34D shows an example of application of the present invention to a PDA (Personal Digital Assistant), which is composed of a main body 3031, a stylus 3032, a display unit 3033, operation buttons 3034, an external interface 3035, etc. A transistor manufactured in accordance with the present invention can be used in the display unit 3033 and, in addition, in various integrated circuits formed on a glass substrate, such as various logic circuits, high-frequency circuits, memories, microprocessors, media processors, graphics LSIs, and encoder LSIs to complete a PDA in accordance with the present invention.

Figure 34E:
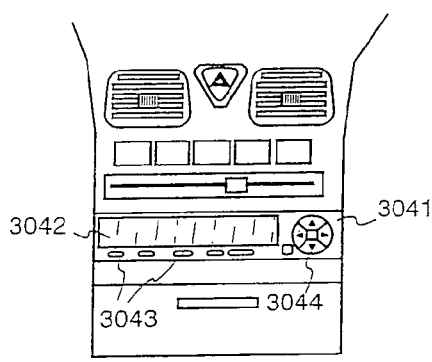

FIG. 34E shows an example of application of the present invention to an audio playback device, specifically, an on-vehicle audio device, which is composed of a main body 3041, a display unit 3042, operation switches 3043 and 3044, etc. A transistor manufactured in accordance with the present invention can be used in the display unit 3042 and, in addition, in various integrated circuits formed on a glass substrate, such as various logic circuits, high-frequency circuits, memories, microprocessors, media processors, graphics LSIs, and amplifier circuits to complete an audio device in accordance with the present invention.

Figure 34G:
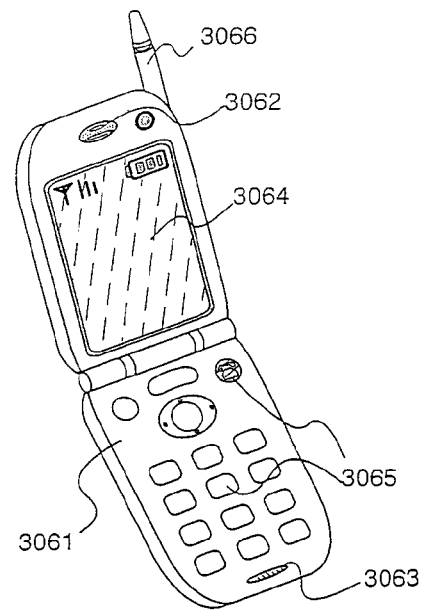
Figure 34F:
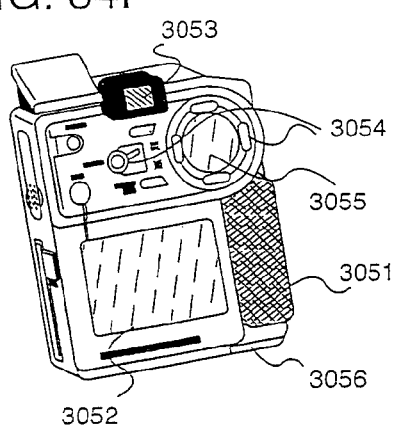

FIG. 34F shows an example of application of the present invention to a digital camera, which is composed of a main body 3051, a display unit (A) 3052, an eye piece 3053, operation switches 3054, a display unit (B) 3055, a battery 3056, etc. A transistor manufactured in accordance with the present invention can be used in the display unit (A) 3052 and the display unit (B) 3056 and, in addition, in various integrated circuits formed on a glass substrate, such as various logic circuits, high-frequency circuits, memories, microprocessors, media processors, graphics LSIs, and encoder LSIs to complete a digital camera in accordance with the present invention.

FIG. 34G shows an example of application of the present invention to a mobile phone, which is composed of a main body 3061, an audio output unit 3062, an audio input unit 3063, a display unit 3064, operation switches 3065, an antenna 3066, etc. A transistor manufactured in accordance with the present invention can be used in the display unit 3064 and, in addition, various integrated circuits formed on a glass substrate, such as various logic circuits, high-frequency circuits, memories, microprocessors, media processors, graphics LSIs, encoder LSIs, and mobile phone LSIs to complete a mobile phone in accordance with the present invention.

Note that, the devices shown here are merely examples and the present invention is not limited to these applications.

As explained above, a straight line stripe pattern having an uneven shape is formed by using an insulating film, an amorphous semiconductor film is deposited on the stripe pattern, and laser light irradiation is performed to obtain a melted state, whereby crystallization is performed. Semiconductor thus flows into concave portions and solidifies, and distortions and stress that accompany crystallization can be concentrated in regions outside of the concave portions. It becomes possible to selectively form regions having poor crystallinity, such as crystal grain boundaries.

A crystalline semiconductor film in which crystal grain boundaries do not exist can be formed by specifying the location of semiconductor elements such as transistors, in particular the location of channel forming regions. Causes of dispersion in characteristics due to crystal grain boundaries and crystal grain faults inadvertently interposing can thus be eliminated, and transistors or a group of transistors having little dispersion in their characteristics can be formed.

In addition, the surface area of the channel forming region can be increased, and the on current can be increased by forming a gate insulating film and a gate electrode overlapping with side surface portions and upper surface portions of the crystalline semiconductor film. Additionally, carriers injected into the gate insulating film, particularly hot carriers, can be reduced by applying a gate voltage from three sides, and transistor reliability can be increased.

What is claimed is:
1. A semiconductor device comprising:
 a crystalline semiconductor film having a channel forming region adjacent to a pair of one conductivity type impurity regions over an insulating film;
 a plurality of insulating stripe patterns over the insulating film, each extending in one direction, a gate insulating film on the crystalline semiconductor film; and a gate electrode on the gate insulating film, wherein a portion of the gate electrode is formed between one of the insulating stripe patterns and the channel forming region, wherein each of the plurality of insulating stripe patterns is not in contact with each other.

2. A semiconductor device according to claim 1, wherein the crystalline semiconductor film grows along the one direction with a preferred orientation of <110>.

3. A semiconductor device according to claim 1, wherein the semiconductor device is at least one selected from the group consisting of a television, a video camera, a personal computer, a personal digital assistant, an audio playback device, a digital camera, and a mobile phone.

4. A semiconductor element according to claim 1, wherein the insulating film is provided over a glass substrate.

5. A semiconductor device comprising:
a crystalline semiconductor film having a channel forming region adjacent to a pair of one conductivity type impurity regions over a first insulating film;
a second insulating film interposed between the crystalline semiconductor film and the first insulating film;
a plurality of insulating stripe patterns over the first insulating film, each extending in one direction,
a gate insulating film on the crystalline semiconductor film; and
a gate electrode on the gate insulating film,
wherein a portion of the gate electrode is formed between one of the insulating stripe patterns and the channel forming region,
wherein each of the plurality of insulating stripe patterns is not in contact with each other, and
wherein upper and bottom surfaces of the second insulating film are flat.

6. A semiconductor device according to claim 5, wherein the crystalline semiconductor film grows along the one direction with a preferred orientation of <110>.

7. A semiconductor device according to claim 5, wherein the semiconductor device is at least one selected from the group consisting of a television, a video camera, a personal computer, a personal digital assistant, an audio playback device, a digital camera, and a mobile phone.

8. A semiconductor element according to claim 5, wherein the first insulating film is provided over a glass substrate.

9. A semiconductor device comprising:
a crystalline semiconductor film having a channel forming region adjacent to a pair of one conductivity type impurity regions over an insulating film;
a plurality of insulating stripe patterns over the insulating film, each extending in one direction,
a gate insulating film on the crystalline semiconductor film; and
a gate electrode on the gate insulating film,
wherein a portion of the gate electrode is formed between one of the insulating stripe patterns and the channel forming region,
wherein each of the plurality of insulating stripe patterns is not in contact with each other,
wherein the crystalline semiconductor film in the channel forming region has a width between 0.01 and 1 µm, and
wherein the crystalline semiconductor film in the channel forming region has a thickness between 0.01 and 3 µm.

10. A semiconductor device according to claim 9, wherein the crystalline semiconductor film grows along the one direction with a preferred orientation of <110>.

11. A semiconductor device according to claim 9, wherein the semiconductor device is at least one selected from the group consisting of a television, a video camera, a personal computer, a personal digital assistant, an audio playback device, a digital camera, and a mobile phone.

12. A semiconductor element according to claim 9, wherein the first insulating film is provided over a glass substrate.

13. A semiconductor device comprising:
a crystalline semiconductor film having a channel forming region adjacent to a pair of one conductivity type impurity regions over a first insulating film;
a second insulating film interposed between the crystalline semiconductor film and the first insulating film;
a plurality of insulating stripe patterns over the first insulating film, each extending in one direction,
a gate insulating film on the crystalline semiconductor film; and
a gate electrode on the gate insulating film,
wherein a portion of the gate electrode is formed between one of the insulating stripe patterns and the channel forming region,
wherein each of the plurality of insulating stripe patterns is not in contact with each other,
wherein upper and bottom surfaces of the second insulating film are flat,
wherein the crystalline semiconductor film in the channel forming region has a width between 0.01 and 1 µm, and
wherein the crystalline semiconductor film in the channel forming region has a thickness between 0.01 and 3 µm.

14. A semiconductor device according to claim 13, wherein the crystalline semiconductor film grows along the one direction with a preferred orientation of <110>.

15. A semiconductor device according to claim 13, wherein the semiconductor device is at least one selected from the group consisting of a television, a video camera, a personal computer, a personal digital assistant, an audio playback device, a digital camera, and a mobile phone.

16. A semiconductor element according to claim 13, wherein the first insulating film is provided over a glass substrate.

* * * * *